US008290060B2

(12) United States Patent  
Limberg

(10) Patent No.: US 8,290,060 B2
(45) Date of Patent: Oct. 16, 2012

(54) STAGGERCASTING OF DTV SIGNALS THAT EMPLOY CONCATENATED CONVOLUTIONAL CODING

(76) Inventor: Allen LeRoy Limberg, Port Charlotte, FL (US)

( * ) Notice: Subject to any disclaimer, the term of this patent is extended or adjusted under 35 U.S.C. 154(b) by 1094 days.

(21) Appl. No.: 12/228,959

(22) Filed: Aug. 18, 2008

(65) Prior Publication Data

US 2009/0052544 A1    Feb. 26, 2009

Related U.S. Application Data

(60) Provisional application No. 60/965,654, filed on Aug. 21, 2007, provisional application No. 60/966,339, filed on Aug. 27, 2007, provisional application No. 61/005,618, filed on Dec. 6, 2007.

(51) Int. Cl.
*H04N 7/12* (2006.01)
(52) U.S. Cl. .................. 375/240.24; 375/240.27
(58) Field of Classification Search ............ 375/240.01, 375/240.02, 240.24, 240.26, 240.27
See application file for complete search history.

(56) References Cited

U.S. PATENT DOCUMENTS

| 5,978,365 A | 11/1999 | Yi |
| 6,094,427 A | 7/2000 | Yi |
| 6,178,317 B1 | 1/2001 | Kroeger et al. |
| 6,792,258 B1 | 9/2004 | Nokes et al. |
| 6,883,021 B2 * | 4/2005 | Ahmed et al. ............. 709/213 |
| 6,892,335 B2 * | 5/2005 | Gueguen .................. 714/701 |
| 7,058,086 B2 | 6/2006 | Marko |
| 7,120,200 B2 | 10/2006 | Alamouti et al. |
| 7,533,328 B2 * | 5/2009 | Alrod et al. ............... 714/786 |
| 7,684,503 B2 * | 3/2010 | Hayashi .................... 375/260 |
| 7,810,124 B2 * | 10/2010 | Cooper et al. ............... 725/94 |
| 7,869,528 B2 * | 1/2011 | Robinson .................. 375/260 |
| 8,027,381 B2 * | 9/2011 | Boyce et al. ............ 375/240.01 |
| 2001/0003089 A1 | 6/2001 | Kroeger et al. |
| 2006/0050780 A1 | 3/2006 | Cooper et al. |
| 2006/0050781 A1 | 3/2006 | Cooper et al. |
| 2006/0056505 A1 | 3/2006 | Ramaswamy et al. |
| 2006/0082474 A1 | 4/2006 | Cooper et al. |
| 2006/0117360 A1 | 6/2006 | Cooper et al. |
| 2006/0126717 A1 | 6/2006 | Boyce et al. |
| 2006/0126733 A1 | 6/2006 | Boyce et al. |
| 2006/0246836 A1 | 11/2006 | Simon |
| 2006/0262651 A1 | 11/2006 | Cooper et al. |
| 2007/0110179 A1 | 5/2007 | Alamouti et al. |
| 2008/0008275 A1 | 1/2008 | Alamouti et al. |
| 2008/0063107 A1 | 3/2008 | Alamouti et al. |

* cited by examiner

*Primary Examiner* — Ricky Ngo
*Assistant Examiner* — Christine Ng

(57) ABSTRACT

8VSB digital television signals employing serially concatenated convolutional coding (SCCC) are transmitted twice in an SCCC staggercasting procedure. In the receiver for such signal "soft" decisions concerning the initial and final transmissions are compared as a basis for synthesizing a set of "soft" decisions for implementing turbo decoding procedures.

In a "punctured" variant of the SCCC staggercasting procedure, SCCC using one type of outer convolutional coding is transmitted at a relatively early time and after a prescribed interval SCCC using another type of outer convolutional coding of the same data is transmitted at a relatively late time. In the receiver for such signal "soft" decisions concerning data bits the initial and final transmissions are compared as a basis for synthesizing a set of "soft" decisions for implementing turbo decoding procedures.

22 Claims, 26 Drawing Sheets

STAGGERCASTING OF DTV SIGNALS THAT EMPLOY CONCATENATED CONVOLUTIONAL CODING This application is filed under 35 U.S.C. 111(a) claiming pursuant to 35 U.S.C. 119(e)(1) benefit of the filing date of provisional patent application Ser. Nos. 60/965,654, 60/966,339 and 61/005,618 filed under 35 U.S.C. 111(b) on 21 Aug. 2007, on 27 Aug. 2007 and on 6 Dec. 2007, respectively. These provisional patent applications are incorporated herein by reference.

The invention relates to digital television (DTV) signals for over-the-air broadcasting, transmitters for such broadcast DTV signals, and receivers for such broadcast DTV signals.

BACKGROUND OF THE INVENTION

The Advanced Television Systems Committee (ATSC) published a Digital Television Standard in 1995 as Document A/53, hereinafter referred to simply as "A/53" for sake of brevity. Annex D of A/53 titled "RF/Transmission Systems Characteristics" is particularly incorporated by reference into this specification. So is Section 5.6.3 titled "Specification of private data services" from Annex C of A/53. In the beginning years of the twenty-first century efforts have been made by some in the DTV industry to provide for more robust transmission of data over broadcast DTV channels without unduly disrupting the operation of so-called "legacy" DTV receivers already in the field. The operation of nearly all legacy receivers is disrupted if ⅔ trellis coding is not preserved throughout every transmitted data field. Also, the average modulus of the signal should be the same as for 8VSB signal as specified in the 1995 version of A/53, so as not to disrupt adaptive equalization in legacy receivers using the constant modulus algorithm (CMA).

Another problem concerning "legacy" DTV receivers is that a large number of such receivers were sold that were designed not to respond to broadcast DTV signals unless de-interleaved data fields recovered by trellis decoding were preponderantly filled with (207, 187) Reed-Solomon forward-error-correction (R-S FEC) codewords of a specific type or correctable approximations to such codewords. Accordingly, in order to accommodate continuing DTV reception by such legacy receivers, robust transmissions are constrained in the following way. Before convolutional byte interleaving, data fields should be preponderantly filled with (207, 187) R-S FEC codewords of the type specified in A/53.

In 2006 engineers of Samsung Electronics Co., Ltd. proposed introducing further-coded ancillary data into adaptation fields of the 187-byte MPEG-2-compatible data packets included in the 207-byte data segments of the 8VSB DTV broadcast signals used in the United States. This scheme, called "A-VSB", was championed because the packet decoders in legacy DTV receivers could readily disregard the further-coded ancillary datastream. This provides a form of backward compatibility in which those legacy DTV receivers can still receive a principal datastream transmitted in the payload data fields of the 187-byte MPEG-2-compatible data packets. There is no backward compatibility, however, in the sense that legacy DTV receivers can usefully decode the information content in the further-coded ancillary datastream. Nominally, the code rate of A-VSB is one-half the code rate of ordinary 8VSB in its less robust form or one-quarter the code rate of ordinary 8VSB in its more robust form. A-VSB uses serially concatenated convolutional coding (SCCC) that incorporates the ⅔ trellis coding characteristic of 8VSB DTV signals as the inner convolutional coding, so SCCC can be accomplished by essentially just halving the ordinary code rate for 8VSB. This form of SCCC is not systematic; that is, the data do not appear in their original form in the signal resulting from the ⅔ trellis coding. The ancillary data are randomized and then subjected to (207, 187) R-S FEC coding, and the resulting (207, 187) R-S FEC codewords are convolutionally interleaved before being subjected to the outer convolutional coding and subsequent bit interleaving. U.S. patent application Ser. No. 11/416,245 of Jeong et alii published 19 Jul. 2007 with publication No. 2007-0168842 and titled "Transmitter and system for transmitting/receiving digital broadcasting stream and method thereof", which is incorporated by reference, describes in considerable detail practices used in A-VSB.

In 2007 Samsung engineers proposed adapting their A-VSB transmission system for mobile reception by DTV receivers that are carried by fast-moving vehicles such as automobiles, buses or railroad passenger cars. Such reception is disrupted by momentary "deep fades" or drop-outs in received signal strength as the vehicle moves through underpasses or passes large buildings blocking the transmission path. To help a mobile DTV receiver withstand these momentary deep fades, the Samsung engineers introduced an outer byte interleaver after the encoder used to generate the (207, 187) R-S FEC codewords supplied for serially concatenated convolutional coding. This outer byte interleaver spread the successive bytes of each (207, 187) R-S FEC codeword apart so far that fewer of them would be lost during a momentary deep fade. Hopefully, so few bytes would be lost in each (207, 187) R-S FEC codeword that the Reed-Solomon decoding apparatus in a DTV receiver designed for mobile reception would be able to correct the codeword and restore the missing bytes.

In 2007 LG Electronics proposed introducing further-coded ancillary data into the 184-byte payload fields of the 187-byte MPEG-2-compatible data packets included in the 207-byte data segments of the 8VSB DTV broadcast signals used in the United States. The LG Electronics system, commonly referred to as "MPH", subjected ancillary data to preliminary two-dimensional coding procedures designed to help a mobile DTV receiver withstand momentary deep fades. This preliminary two-dimensional coding comprised transversal Reed-Solomon (TRS) coding of ancillary signals within a Reed-Solomon frame extending over 968 milliseconds or twenty 8VSB frame times. This preliminary two-dimensional coding further comprised periodic cyclic-redundancy-check coding used for locating byte errors for the TRS.

Another known technique for overcoming temporary fading is called "staggercasting", a variant of which Thomson, Inc. has proposed be used in robust 8VSB transmissions. Staggercasting can also overcome certain types of intermittent radio-frequency interference. Staggercasting communications systems transmit a composite signal including two component content-representative signals, one of which is delayed with respect to the other. The composite signal is broadcast to one or more receivers through a communications channel. At a receiver, delayed response to the earlier transmitted component content-representative signal supplied from a buffer memory is contemporaneous in time with the later transmitted component content-representative signal. Under normal conditions, the receiver detects and reproduces the content of the later transmitted signal as soon as it is received. However, if a drop-out in received signal strength occurs, then the receiver detects and reproduces the content of the earlier transmitted signal as read from buffer memory. If the delay period and the associated delay buffer are large enough, then fairly long drop-outs in received signal strength can be overcome. This capability not only requires a several-fold increase in the amount of memory required in a receiver; it halves the effective code rate of the transmission.

The inventor perceived that the processing of "soft" decisions in turbo decoding allows a more sophisticated approach to be taken for the reception of staggercasting. "Soft" decisions concerning the contents of an earlier transmitted turbo codeword and concerning the contents of a later transmitted repeat of the earlier transmitted turbo codeword can be analyzed for selecting which of corresponding portions of the two turbo codewords as received is more likely to be correct. The selection procedure can synthesize a turbo codeword that is more likely to be correct than either of the turbo codewords from which the parts of the synthesized turbo codeword are drawn. The synthesized turbo codeword can then be subjected to turbo decoding and R-S decoding procedures.

The inventor subsequently invented a "punctured staggercasting" in which parallel concatenated convolutional coding (PCCC) was dissected for transmission. Data and the parity bits for one of the two convolutional codes used in the PCCC are transmitted at an earlier time in "punctured staggercasting". Subsequently, at a later time, the data are retransmitted together with the parity bits for the other of the two convolutional codes used in the PCCC. In the receiver "soft" decisions concerning the originally transmitted data and "soft" decisions concerning the re-transmitted data are compared, and a best estimate of the data is developed for PCCC decoding. Deep fading conditions that prevent successful reception of one of the transmissions may not affect the other transmission severely enough to prevent its being successfully received.

Some time after this, the inventor realized that this "punctured staggercasting" concept can be applied to SCCC of the types used in A-VSB and in MPH. Of especial interest is the application of "punctured staggercasting" to SCCC in which the earlier transmission and the later transmission are each at a code rate that is nominally one half that of ordinary 8VSB. Overall, a code rate that is nominally one quarter that of ordinary 8VSB results, and AWGN performance is expected to be similar to that of previously proposed A-VSB or MPH signals having a code rate that is nominally one quarter that of ordinary 8VSB. However, except when SNR is very low for both transmissions of the "punctured staggercasting" signals, reception should be possible. Deep fading conditions can be tolerated that would not be successfully received using the previously proposed A-VSB or MPH signals having a code rate that is nominally one quarter that of ordinary 8VSB.

A problem receivers for staggercast SCCC or PCCC DTV signals are prone to is difficulty in changing channels quickly owing to the latent delay involved in combining the earlier transmitted signals with later transmitted signals. The inventor discerned that this problem can be alleviated when strong signals are received. When a channel is initially tuned to, only the later transmitted words of the staggercast SCCC or PCCC are decoded until earlier transmitted words that have been temporarily stored for combining with the later transmitted words of the staggercast SCCC or PCCC become available. This approach works best if earlier transmitted words and later transmitted words of the staggercast SCCC or PCCC are interleaved in time.

SUMMARY OF THE INVENTION

One aspect of the invention is a digital television signal in which at least the data components of serially concatenated convolutional codes are transmitted twice within that signal, the second transmission of at least the data component of each concatenated convolutional code being delayed until a time subsequent to the first transmission. Preferably, different convolutional coding generates the parity bytes accompanying each transmission of the data. Another aspect of the invention is digital television transmitter apparatus for such digital television signal. Still another aspect of the invention is digital television receiver apparatus for such digital television signal. Preferred embodiments of digital television receiver apparatus for such digital television signal include apparatus for comparing portions of each codeword of the outer convolutional coding and the repeated portion or portions thereof, providing a basis for synthesizing turbo codewords supplied for turbo decoding.

DETAILED DESCRIPTION

Figure 1:
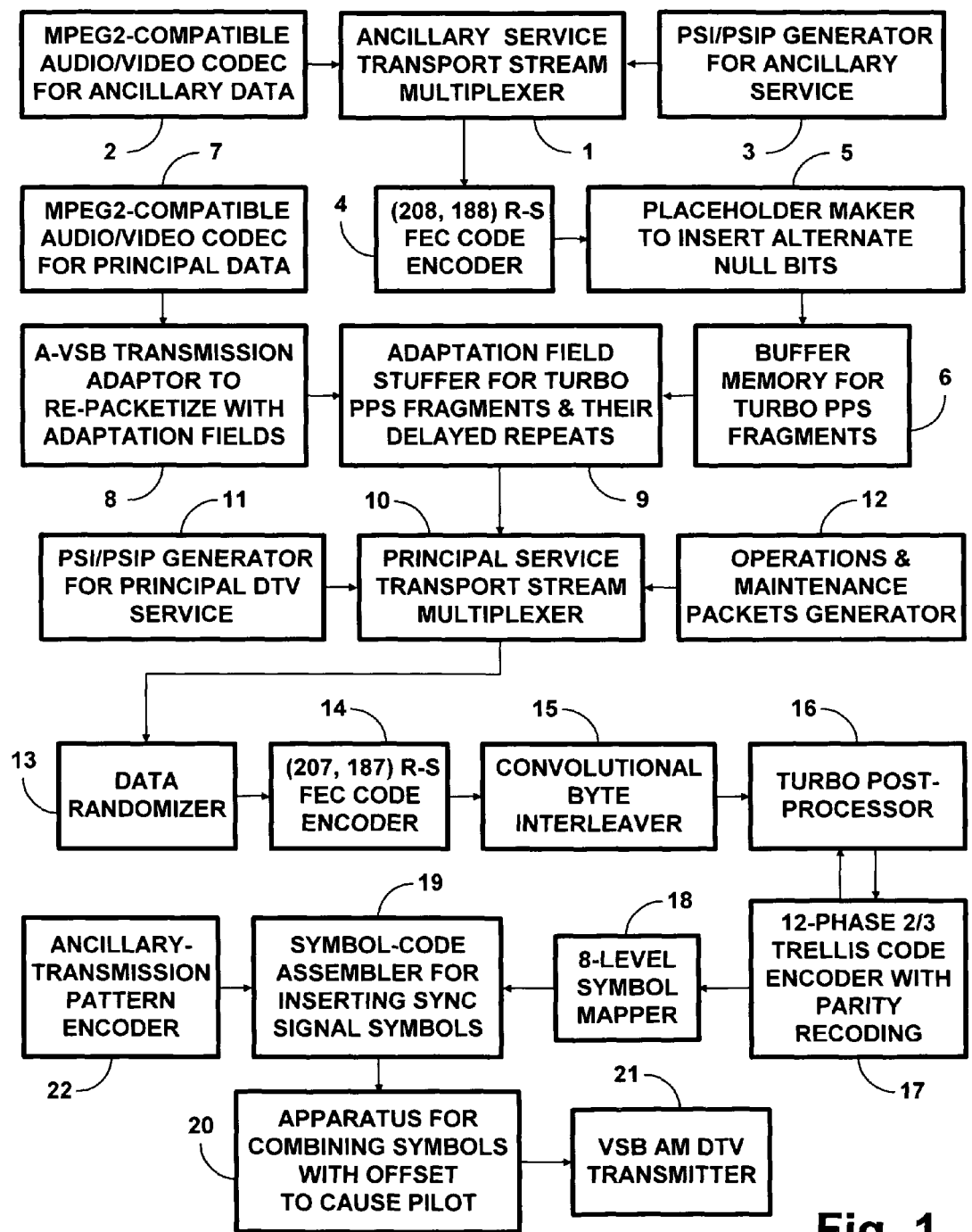
FIG. 1 is a schematic diagram of 8VSB DTV transmitter apparatus of a first type, which transmitter apparatus is modified in accordance with an aspect of the invention to provide for staggercasting of SCCC words.

FIG. 1 shows 8VSB DTV transmitter apparatus of a first type. In this transmitter apparatus a time-division multiplexer 1 is connected for receiving 187-byte MPEG-2-compatible data packets supplied to respective input ports thereof from the output port of a audio/video codec 2 and from the output port of a PSI/PSIP generator 3. The codec 2 and the PSI/PSIP generator 3 are associated with the transmission of ancillary data that are turbo coded. (The acronym PSI stands for Program Specification Information, and the acronym PSIP stands for Program and System Information Protocol.) The multiplexer 1 is connected for applying the 187-byte data packets in the ancillary-service transport stream that it assembles to an encoder 4 for (208, 188) Reed-Solomon forward-error-correction coding. The R-S FEC coding can be utilized by a DTV receiver of the sort shown in FIG. 2 to determine when the decoding of turbo coding regenerates one of the outer (208, 188) R-S FEC codewords from the encoder 4. The output port of the encoder 4 is connected for supplying outer (208, 188) R-S FEC codewords to the input port of a turbo pre-processor 5, which inserts placeholder bits into these codewords to reduce their code rate 2-to-1 (or 4-to-1) in a turbo pre-processing stream (PPS). This turbo PPS is generated per known prior-art practice in A-VSB transmitter exciter apparatus.

In a departure from conventional practice in A-VSB transmitter exciter apparatus, the resulting two (or four) 208-byte fragments of the turbo PPS generated from each (208, 188) R-S FEC codeword are written into successive rows of temporary storage locations in a buffer memory 6. The buffer memory 6 is preferably a dual-port random access memory written via its random-access port and read via its shift register output port. The two (or four) 208-byte fragments of the turbo PPS generated from each (208, 188) R-S FEC codeword are read from these successive rows of temporary storage locations in the buffer memory 6 a first time and then a second time after a delay of a second or so. The delayed repeat reading of the two (or four) 208-byte fragments of the turbo PPS generated from each (208, 188) R-S FEC codeword is used to implement staggercasting of turbo codewords.

An audio/video codec 7 supplies 187-byte MPEG-2-compatible data packets associated with the associated with ordinary 8VSB signal transmission used for the principal DTV service, the payload information in which data packets can be usefully received by legacy DTV receivers. The output port of the codec 7 from which these packets are supplied is connected to the input port of an A-VSB transmission adaptor 8. At times, the A-VSB transmission adaptor 8 generates 187-byte MPEG-2-compatible packets with adaptation fields supplied from an output port thereof to a first input port of an adaptation field stuffer 12. Some of the packets supplied from the output port of the A-VSB transmission adaptor 8 are programmed to include payload data fields into the successive ones of which the information from the data packets supplied by the codec 7 is transferred. The packet identification (PID) in the header of each of these 187-byte MPEG-2-compatible packets conforms with the PID in the header of the packet from which the transferred information is extracted. The continuity counts in the headers of packets identified by similar PID that are successively supplied from the output port of the A-VSB transmission adaptor 8 are consecutively numbered modulo sixteen. The adaptation field of each of these MPEG-2-compatible data packets includes deterministic-trellis-reset (DTR) bytes and may further include subsequent supplementary-reference-sequence (SRS) bytes.

At times others of the packets supplied from the output port of the A-VSB transmission adaptor 8 are programmed to be null packets that do not include payload data fields, and their adaptation fields will contain turbo coding. All bits of packet identification (PID) in the header of each 187-byte null packet are ONEs (or other prescribed value) presumably causing the null packet to be discarded by legacy receivers, and the continuity count components of successive ones of these packets are consecutively numbered modulo sixteen. The adaptation fields extend to the conclusions of the null packets. The adaptation field stuffer 9 stuffs the turbo PPS read to a second input port thereof from the output port of the buffer memory 6 into the final portions of those adaptation fields. The initial portions of those adaptation fields each include DTR bytes and may further include subsequent SRS bytes.

The output port of the adaptation field stuffer 9 is connected to a first input port of a time-division multiplexer 10 used to assemble the principal-service transport stream of MPEG-2-compatible data packets supplied from the output port thereof. The output port of a PSI/PSIP generator 11 is connected to a second input port of the multiplexer 10 for supplying MPEG-2-compatible data packets containing PSI/PSIP information about the principal DTV service. The output port of a generator 12 of operation and maintenance packets (OMP) is connected for supplying those MPEG-2-compatible data packets to a third input port of the multiplexer 10. The output port of the multiplexer 10 is connected to the input port of a data randomizer 13.

The data randomizer 13 exclusive-ORs the MPEG-2-compatible data packets in the complete transport stream assembled by the multiplexer 10 with portions of a pseudo-random binary sequence (PRBS) prescribed in A/53, Annex D, §4.2.2 titled "Data randomizer". The data randomizer 13 is connected for supplying the resulting randomized 187-byte MPEG-2-compatible data packets to an encoder 14 that generates a respective (207, 187) Reed-Solomon forward-error-correction codeword in response to each of these randomized packets. This inner (207, 187) R-S FEC code encoder 14 is of the sort described in A/53, Annex D, §4.2.3 titled "Reed-Solomon encoder". The output port of the (207, 187) R-S FEC code encoder 14 is connected for supplying its 207-byte codewords to the input port a convolutional byte interleaver 15 as described in A/53, Annex D, §4.2.4 titled "Interleaving". The output port of the interleaver 15 is connected to supply the convolutionally interleaved bytes of the (207, 187) R-S FEC codewords to the input port of a turbo post-processor 16. The turbo post-processor 16 can be of the type used in known prior-art A-VSB exciter apparatus, but preferably is of a type described with reference to FIG. 3 further on in this application.

The turbo post-processor 16 includes initial circuitry for altering the less significant bit of each 2-bit nibble of the DTR bytes at the beginning of each adaptation field of MPEG-2-compatible data packets that subsequently includes STR bytes or a fragment of turbo PPS. The turbo post-processor 16 further includes circuitry for selecting successive parts of the turbo PPS from the adaptation fields of the MPEG-2-compatible data packets that are to include turbo coding. The successive parts of the turbo PPS as so selected are supplied to a constituent systematic convolutional encoder that generates an initial set of parity bits to replace the placeholder bits of the turbo PPS in its convolutional code output. The convolutional code output from the convolutional encoder is supplied to a bit interleaver. The successive parts of the bit interleaver response are used to replace the successive parts of the turbo PPS in the adaptation fields of the MPEG-2-compatible data packets that include turbo coding. The replacement of the placeholder bits in the turbo PPS by parity bits in the turbo coding invalidates previous (207, 187) R-S FEC coding by the encoder 14. Accordingly, the field of byte-interleaved data segments is de-interleaved. Then, the MPEG-2-compatible data packets of the de-interleaved data are extracted and subjected to new (207, 187) R-S FEC coding. The parity bytes for the new (207, 187) R-S FEC codewords are then substituted for the parity bytes of the old (207, 187) R-S FEC codewords in the field of byte-interleaved data segments comprising the output signal from the turbo post-processor 16.

The output port of the turbo post-processor 16 is connected to the input port of a 12-phase encoder 8 for ⅔ trellis code, which encoder 8 generates a further set of parity bits for the SSC turbo coding. The 12-phase encoder 17 uses the ⅔ trellis coding algorithm prescribed in A/53, Annex D, §4.2.5 titled "Trellis coding". FIG. 1 shows the 12-phase encoder 17 for ⅔ trellis code being of a type that employs parity bit recoding, which is known prior-art practice in A-VSB transmitter exciter apparatus. The less significant bit of each 2-bit nibble of the three DTR bytes in each segment of byte-interleaved data from the turbo post-processor 16 can be recoded to maintain continuity of turbo coding from one data segment containing a fragment of turbo coding to the next data segment containing a continuing fragment of the same turbo coding. However, this need not be done and cannot be done unless DTR is used.

The 12-phase encoder 17 supplies groups of three bits to an 8-level symbol mapper 18 as also described in §4.2.5, which 8-level symbol mapper 18 is customarily constructed using read-only memory (ROM). The mapper 18 is connected to supply 8-level symbols to a symbol code assembler 19 which inserts data segment synchronization (DSS) symbols and data field synchronization (DFS) symbols into the symbol stream before it is supplied to apparatus 20. The apparatus 20 combines the symbols with an offset to supply digital modulating signal to a vestigial-sideband amplitude-modulation (VSB AM) transmitter 21 for DTV signal.

The reserved section of the DFS signal at the beginning of each data field typically contains a code sequence specifying the pattern of the ancillary (turbo-code) transmission in at least that field. FIG. 1 shows a generator 22 of such these code sequences connected for supplying them to the symbol code assembler 19.

The FIG. 1 transmitter apparatus can be advantageously modified, so as to insert the placeholder bits to generate the turbo pre-processing stream (PPS) after buffer memory, rather than before. In such modification a buffer memory with half the amount of temporary bit storage of the buffer memory 6 is written to from the R-S FEC code encoder 4 and read to a turbo pre-processor before the adaptation field stuffer 9. This turbo pre-processor inserts a respective placeholder bit after every bit of R-S FEC code read thereto from the buffer memory.

Figure 2:
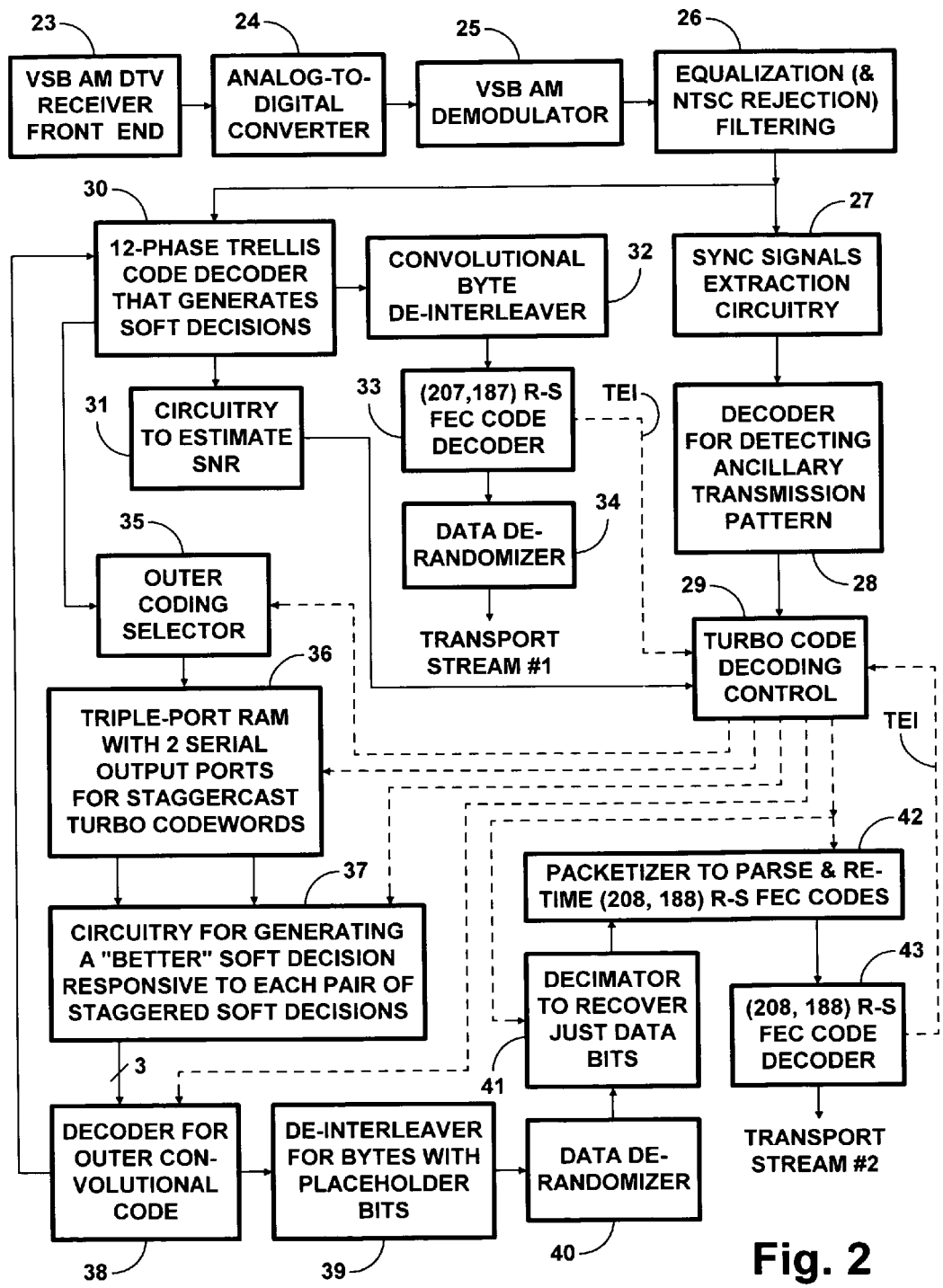
FIG. 2 is a schematic diagram of DTV receiver apparatus for usefully receiving signals as transmitted by the FIG. 1 DTV transmitter apparatus, which receiver apparatus embodies an aspect of the invention.

FIG. 2 shows receiver apparatus for DTV signals transmitted by the FIG. 1 transmitter apparatus supposing that the turbo post-processor 16 is of the type used in known prior-art A-VSB exciter apparatus. The FIG. 2 DTV receiver apparatus includes a vestigial-sideband amplitude-modulation (VSB AM) DTV receiver front-end 23 for selecting a radio-frequency DTV signal for reception, converting the selected RF DTV signal to an intermediate-frequency DTV signal, and for amplifying the IF DTV signal. An analog-to-digital converter 24 is connected for digitizing the amplified IF DTV signal supplied from the DTV receiver front-end 23. A demodulator 25 is connected for demodulating the digitized VSB AM IF DTV signal to generate a digitized baseband DTV signal, which is supplied to digital filtering 26 for equalization of channel response and for rejection of co-channel interfering NTSC signal. Synchronization signals extraction circuitry 27 is connected for receiving the digital filtering 26 response. Responsive to data-field-synchronization (DFS) signals, the sync signals extraction circuitry 26 detects the beginnings of data frames and fields. Responsive to data-segment-synchronization (DSS) signals, the sync signals extraction circuitry 26 detects the beginnings of data segments. The FIG. 2 DTV receiver apparatus uses the DSS and DFS signals for controlling its operations similarly to the way this is conventionally done. FIG. 2 does not explicitly show the circuitry for effecting these operations.

A decoder 28 for detecting the ancillary transmission pattern responds to the ancillary transmission pattern code contained in the reserved portions of DFS signals separated by the synchronization signals extraction circuitry 27. The decoder 28 is connected for supplying ancillary transmission pattern information to a first input port of turbo code decoding control circuitry 29 that controls turbo decoding in the FIG. 2 DTV receiver apparatus. The decoder 28 can, for example, be similar to those previously designed for use in enhanced-VSB DTV signal receiver apparatuses.

The input port of a 12-phase trellis code decoder 30 of a type that generates "soft" decisions as well as "hard" decisions is connected for receiving the digital filtering 24 response. For example, the decoder 30 employs the soft-output Viterbi algorithm (SOVA). By way of alternative example, the decoder 30 employs the maximum a posteriori (MAP) algorithm. The 12-phase trellis code decoder 30 is connected for supplying its "soft" decisions to the input port of circuitry 31 to estimate the signal-to-noise ratio (SNR) of the baseband DTV signal. The circuitry 31 estimates the SNR based on the variances of the "soft" decisions from "hard" decision values. The larger the variance over time, the lower the estimated SNR supplied from the output port of the circuitry 31 to a second input port of the turbo code decoding control circuitry 29. The turbo code decoding control circuitry 29 uses the estimated SNR to determine the maximum number of iterations to be used when decoding each turbo codeword.

The input port of a convolutional byte de-interleaver 32 is connected for receiving soft-decision decoding results from the output port of the trellis code decoder 30. The output port of de-interleaver 32 provides convolutional byte-by-byte de-interleaving of at least the hard-decision portions of those soft-decision decoding results to the input port of a decoder 33 of (207, 187) R-S FEC codewords. Preferably, the R-S decoder 33 is of a sort that utilizes soft-decision information concerning the de-interleaved (207, 187) R-S FEC codewords to improve overall performance of the decoders 30 and 33. The R-S decoder 33 is connected for supplying randomized data packets to a data de-randomizer 34, which exclusive-ORs the bits of the randomized data packets with appropriate portions of the PRBS prescribed in A/53, Annex D, §4.2.2 to generate de-randomized MPEG-2-compatible data packets of a first, principal transport stream. Insofar as the R-S decoder 33 is capable, it corrects the 187-byte randomized data packets that it supplies to the data de-randomizer 34. The R-S decoder 33 is connected for supplying the turbo code decoding control circuitry 29 indications of whether there are uncorrected byte errors in each MPEG-2 compatible data packet in the first transport stream that the de-randomizer 34 generates. If the R-S decoder 33 finds a recovered data packet to be correct or corrects the recovered data packet, the turbo code decoding control circuitry 29 will use this information to control the filling of subsequent buffer memory from the first transport stream. FIG. 2 does not show this subsequent buffer memory. The elements 23-27, 30 and 32-34 operate similarly to corresponding elements in a legacy DTV receiver only capable of usefully receiving ordinary 8VSB signals as prescribed by A/53 as published in September 1995.

The input port of a turbo-coding selector 35 is connected for receiving "soft"-decision decoding results from the trellis code decoder 30. The turbo-coding selector 35 reproduces at its output port the "soft"-decision decoding results pertaining to turbo coding that are contained in the adaptation fields of selected data packets. The locations of these "soft"-decision decoding results in the data field are specified for the turbo-coding selector 35 by the turbo code decoding control circuitry 29 responsive to the ancillary transmission pattern information detected by then decoder 28, for example. In alternative embodiments of the DTV receiver apparatus, other than that specifically shown in FIG. 2, the locations of these "soft"-decision decoding results in the data field are specified by turbo code decoding control circuitry responsive to ancillary transmission pattern information detected from OMP. FIG. 2 shows the output port of the turbo-coding selector 35 connected for supplying its response to a triple-port random-access memory (RAM) 36.

More particularly, in the FIG. 2 DTV receiver apparatus the "soft"-decision decoding results pertaining to turbo coding supplied from the output port of the turbo-coding selector 35 are written to a random-access input port of the RAM 36 for temporary storage therewithin. In addition to its random-access input port, the RAM 36 has first and second serial output ports. "Soft" decisions concerning the first transmission of a staggercast turbo codeword are read from the second serial output port concurrently with "soft" decisions concerning the second transmission of the staggercast turbo codeword repeating its first transmission being read from the first serial output port. The parallel loading of the RAM 36 shift registers for supplying "soft" decisions to respective serial output ports takes into account the fact that the data bits submitted for turbo coding in the transmitter apparatus of first type have been subjected to interleaving by the convolutional byte interleaver 15. The decoding control circuitry 29 controls the writing and reading operations of the memory 36 although FIG. 2 does not explicitly show the control connections for doing so.

The first and second serial output ports of the memory 36 respectively connect to first and second input ports of circuitry 37 for generating a "better" soft decision responsive to each pair of "soft" decisions concurrently read thereto from the memory 36. The circuitry 37 compares each pair of concurrent "soft" decisions read thereto. The "better" one of the "soft" decisions is selected for application to the output port of the circuitry 37. The "better" of the concurrent "soft" decisions is the one with greater probability of being correct. If two concurrent "soft" decisions have equal probability of being correct, a prescribed one of the pair is selected by default as the "better" decision. In more sophisticated designs of the circuitry 37, the probability of error in the selected "soft" decision is adjusted according to the degree of agreement or disagreement of the two concurrent "soft" decisions. These adjustments can be made referring to look-up tables stored in read-only memory. Each successive turbo codeword that is synthesized by the circuitry 37 is supplied from the output port thereof to the input port of a decoder 38 for the outer convolutional code of the serially concatenated convolutional code (SCCC).

In sophisticated designs of the circuitry 37, the synthesis of the soft-decision turbo codeword is also aided by extrinsic information concerning the probability of each "soft" decision being correct. The transport-error-indication information generated by the R-S decoder 32 is one source of such extrinsic information. The bits from an MPEG-2-compatible data packet that the R-S decoder 32 has found to be correct or has been able to correct have an increased probability that their hard-decision component is correct. Indications of drop-outs in signal strength supplied by the automatic gain control (AGC) circuitry of the DTV receiver can be used by the circuitry 37 to help determine which of the "soft" decisions concurrently read thereto from the memory 36 is the one with greater probability of being correct.

FIG. 2 shows circuitry for recovering (208, 188) R-S FEC coding of the ancillary service transport stream from the turbo decoding results supplied from the output port of the turbo decoder 38. Presuming the FIG. 2 receiver apparatus to be receiving signal from the FIG. 1 DTV transmitter apparatus, this (208, 188) R-S FEC coding reproduces, except for possible residual corruption owing to noise, that (208, 188) R-S FEC coding generated by the encoder 4 in the FIG. 1 DTV transmitter apparatus. The output port of the turbo decoder 38 is connected to the input port of a convolutional byte de-interleaver 39. The turbo decoder includes output circuitry for re-inserting placeholder bits in the bytes of data it supplies to the input port of the byte de-interleaver 39. The output port of the byte de-interleaver 39 is connected to the input port of a data randomizer 40. The byte de-interleaver 39 and the data randomizer 40 cooperate for essentially reproducing the turbo PPS fragments that were stuffed into the adaptation fields of MPEG-2-compatible packets by the adaptation field stuffer 9, presuming the FIG. 2 receiver apparatus to be receiving signal from the FIG. 1 DTV transmitter apparatus. The byte de-interleaver 39 and the data randomizer 40 are operated over a data field only as wide as the portions of the adaptation fields that can contain turbo coding. The output port of the data randomizer 40 is connected for supplying reproduced turbo PPS fragments to a decimator 41 that erases parity bits (or placeholder replacements if such there are) to recover just data bits in output signal furnished from its output port. The output port of the decimator 41 is connected to supply the data bits to the input port of an assembler 42. The assembler 42 parses (208, 188) R-S FEC codewords within that data and re-times the codewords to be supplied from its output port to the input port of the decoder 43 for the (208, 188) R-S FEC coding.

The R-S decoder 43 attempts to correct any remnant errors in each (208, 188) R-S FEC codeword that is supplied to its input port and supplies from its output port the MPEG-2-compatible packet from each codeword that is correct or was corrected thereby. These MPEG-2-compatible packets flow as a second transport stream associated with the ancillary service. The R-S decoder 43 is further connected for supplying the turbo code decoding control circuitry 29 indications of byte errors in the 188-byte packets of ancillary data. The turbo code decoding control circuitry 29 uses this information to control the filling of subsequent buffer memory written from the second transport stream. FIG. 2 does not show this subsequent buffer memory. DTV receiver designs are possible in which the first and second transport streams are combined into a single transport stream using a common buffer memory. In such case, the turbo code decoding control circuitry 29 includes circuitry for arbitrating the order in which packets from the first and second transport streams are to be written into the common buffer memory.

If computation time is not at a premium, the turbo codewords read serially from the first and second output ports of the memory 36 may also be turbo decoded, de-interleaved, de-randomized and R-S decoded individually. Occasionally, one of these computations may succeed when computations on the turbo codeword synthesized by the circuitry 37 are unsuccessful. If the first transmission of a staggercast turbo codeword can be successfully decoded, de-interleaved, de-randomized and R-S decoded individually before its repeat is received, further processing of that turbo codeword can be dispensed with to save the power associated with such further processing.

Figure 3:
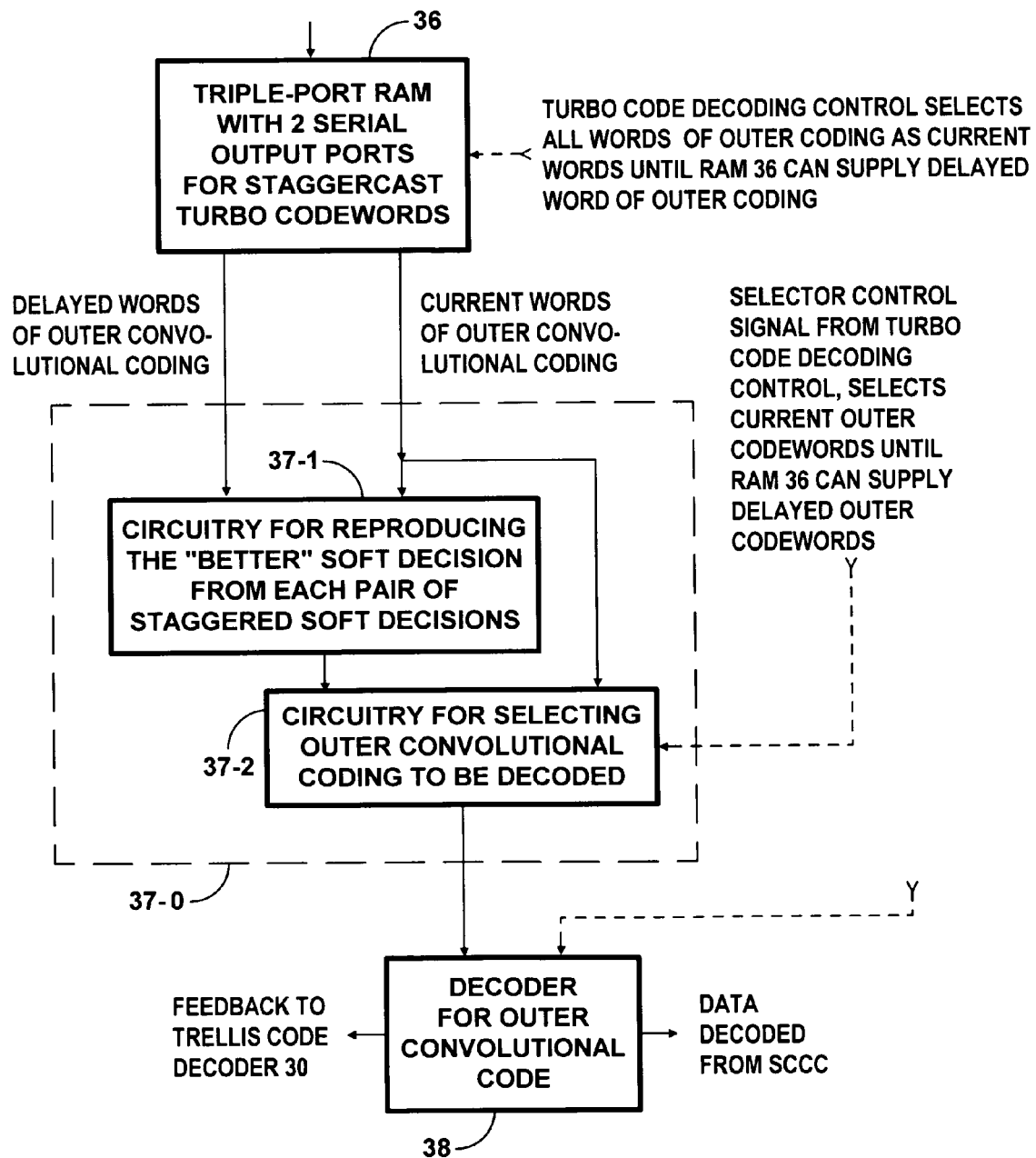
FIG. 3 is a schematic diagram of circuitry used in the FIG. 2 DTV receiver apparatus to facilitate acquisition of staggercast DTV signals during power-up or after a channel change.

FIG. 3 shows in more detail a particular embodiment 37-0 of the circuitry 37 used in the FIG. 2 DTV receiver apparatus, which circuitry 37-0 is designed to facilitate acquisition of staggercast DTV signals during power-up or after a channel change. The circuitry 37-0 includes circuitry 37-1 for reproducing the "better" one of each pair of "soft" decisions concerning each bit of the outer convolutional coding included in the staggered transmission thereof. The circuitry 37-1 is capable of such selective reproduction only after the RAM 36 can supply it with valid delayed outer convolutional codewords. The RAM 36 cannot supply valid delayed outer convolutional codewords to the circuitry 37-1 until some time after power-up or a channel change. Circuitry 37-2 is connected for responding to control signal it receives from the turbo decoding control circuitry 29 to select the outer convolutional codewords that the circuitry 37-2 reproduces in its response supplied to the decoder 38 for decoding. Until the RAM 36 can supply valid delayed outer convolutional codewords to the circuitry 37-1 some time after power-up or a channel change, the control signal applied to the circuitry 37-2 conditions the circuitry 37-2 to reproduce the current outer convolutional codewords it is supplied from the RAM 36. When the RAM 36 is subsequently able to supply valid delayed outer convolutional codewords to the circuitry 37-1, the control signal applied to the circuitry 37-2 conditions the circuitry 37-2 to reproduce the response of the circuitry 37-1 for decoding by the decoder 38.

There are some further measures that can be taken to speed acquisition of staggercast DTV signals during power-up or after a channel change. The MPEG-2-compatible data packets containing the first transmission of an outer convolutional codeword need not be delayed until after the second transmission of the previous outer convolutional codeword. Instead, the MPEG-2-compatible data packets containing the first transmission of an outer convolutional codeword can be time-division multiplexed with the MPEG-2-compatible data packets containing the second transmission of the previous outer convolutional codeword. Provided that received signal strength is sufficient, this will speed acquisition of staggercast DTV signals during power-up or after a channel change. This measure is not practical if transmissions of staggercasting are infrequent. FIG. 3 shows a measure that can be taken in the DTV receiver to speed the acquisition of staggercast DTV signals during power-up or after a channel change. During the times preceding such an acquisition, the turbo code decoding control circuitry 29 conditions the shift register within the RAM 36 used to supply current words of the outer convolutional coding to the circuitry 37 to be loaded with the second transmissions of outer convolutional codewords as well as with the first transmissions of outer convolutional codewords.

Figure 4:
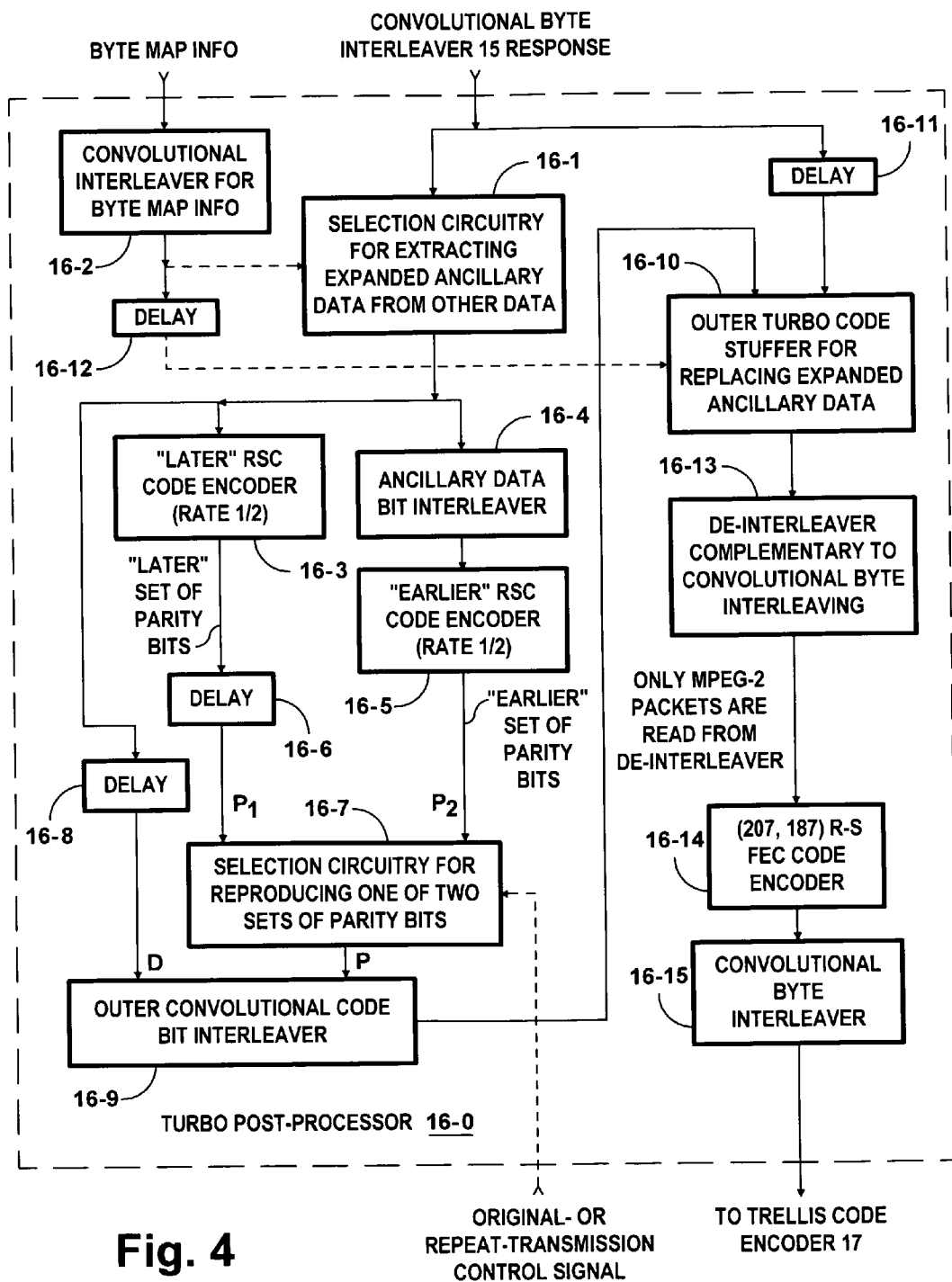
FIG. 4 is a schematic diagram of a turbo post-processor of novel type included in a modification of the FIG. 1 DTV transmitter apparatus to provide for "punctured" staggercasting of SCCC words.

FIG. 4 shows a turbo post-processor 16-0 of novel type replacing the turbo post-processor 16 in a modification of the FIG. 1 DTV transmitter apparatus that provides for "punctured" staggercasting of SCCC words. The turbo post-processor 16-0 includes selection circuitry 16-1 for extracting expanded ancillary data from other data. The selection circuitry 16-1 is connected for receiving as its input signal the response of the convolutional byte interleaver 15. Byte map information supplied to the turbo post-processor 16-0 is applied as the input signal to a convolutional interleaver 16-2 for byte map information. The convolutional interleaver 16-2 responds to supply the selection circuitry 16-1 with control information indicating the occurrence of expanded ancillary data in the response of the convolutional byte interleaver 15. This control information conditions the selection circuitry 16-1 to reproduce in its own response the expanded ancillary data in the response of the convolutional byte interleaver 15, isolated from the other data in the interleaver 15 response.

The expanded ancillary data in the response of the selection circuitry 16-1 is subjected not only to "later" outer convolutional coding similar to that in ordinary A-VSB turbo post processing, but additionally to "earlier" outer convolutional coding not performed in ordinary A-VSB turbo post processing. A recursive systematic convolutional code encoder 16-3 is connected for receiving the response of the selection circuitry 16-1 and responding to this input signal to perform the "later" outer convolutional coding, which is similar to that in ordinary A-VSB turbo post processing. A bit-interleaver 16-4 for expanded ancillary data is connected for receiving the response of the selection circuitry 16-1 and supplying its bit-interleaved response to a recursive systematic convolutional code encoder 16-5 as input signal thereto. The RSC code encoder 16-5 responds to this input signal to perform the "earlier" outer convolutional coding. Delay circuitry 16-6 delays an "later" set of parity bits generated by the "later" RSC code encoder 16-3 to provide temporal alignment with an "earlier" set of parity bits generated by the "earlier" RSC code encoder 16-5. I.e., the delay circuitry 16-6 compensates for the latency of the bit-interleaver 16-4. Selection circuitry 16-7 is connected to reproduce the delayed "later" set of parity bits supplied from the delay circuitry 16-6 during the later transmission of a set of data bits. Selection circuitry 16-7 is connected to reproduce the "earlier" set of parity bits generated by the RSC code encoder 16-5 during the earlier transmission of a set of data bits. This selective reproduction by the selection circuitry 16-7 is controlled by a control signal supplied to the turbo post-processor 16-0 indicating whether the currently transmitted data is the original transmission of those data or is a repeated transmission of those data.

Delay circuitry 16-8 delays the expanded ancillary data in the response of the selection circuitry 16-1 to provide temporal alignment with the set of parity bits reproduced by the selection circuitry 16-7. A bit-interleaver 16-9 for outer-convolutional code merges the delayed expanded ancillary data from the delay circuitry 16-8 with the parity bits selected by the selection circuitry 16-1 to generate an outer convolutional code the bits of which are subsequently interleaved in accordance with usual A-VSB practice. The bit-interleaver 16-9 is connected for supplying the bit-interleaved outer convolutional code in its response to an outer-turbo-code stuffer 16-10 as one of its input signals.

Delay circuitry 16-8 delays the response of the convolutional byte interleaver 15 to compensate for the latent delay in the procedures used to generate the bit-interleaved outer convolutional code received by the outer-turbo-code stuffer 16-10 as one of its input signals. The delayed response of the convolutional byte interleaver 15 is supplied by the delay circuitry 16-8 to the outer-turbo-code stuffer 16-10 as another of its input signals. Delay circuitry 16-12 delays the control information generated by the convolutional interleaver 16-2 that indicates the occurrence of expanded ancillary data in the response of the convolutional byte interleaver 15. The delay introduced by the delay circuitry 16-12 is similar to the delay introduced by the delay circuitry 16-8, and the delay circuitry 16-12 is connected to apply the delayed control information to the outer-turbo-code stuffer 16-10 for controlling its selective reproduction of one of its two input signals. The delayed control information applied to the outer-turbo-code stuffer 16-10 conditions it to reproduce in its output response all of the delayed response of the convolutional byte interleaver 15 supplied to the stuffer 16-10 by the delay circuitry 16-8 except for the expanded ancillary data. The delayed control information applied to the outer-turbo-code stuffer 16-10 further conditions it to reproduce in its output response the bit-interleaved outer convolutional code supplied to the stuffer 16-10 by the bit-interleaver 16-9 as a replacement for the expanded ancillary data.

The response of the outer-turbo-code stuffer 16-10 is supplied to a de-interleaver 16-13 performing de-interleaving complementary to the interleaving done by the convolutional byte interleaver 15. If deterministic trellis resetting (DTR) is used, the modifications of $X_1$ bits are fed back to the memory used in the de-interleaver 16-13. The bytes of the 187-byte MPEG-2-compatible data packets that appear in the de-interleaver 16-13 response are supplied to an encoder 16-14 that generates a respective (207, 187) Reed-Solomon forward-error-correction codeword in response to each of these packets. These (207, 187) R-S FEC codewords take into account the changes made in the packets owing to the substitution of outer convolutional coding for the expanded ancillary data by the outer turbo code stuffer 16-0 and owing to DTR. The R-S encoder 16-14 is of the sort described in A/53, Annex D, §4.2.3 titled "Reed-Solomon encoder". A convolutional byte interleaver 16-15 is connected for convolutionally interleaving the (207, 187) R-S FEC codewords supplied from the R-S encoder 16-14 to generate the output signal supplied from the turbo post-processor 16-0 to the trellis code encoder 17 as input signal thereto.

Figure 5:
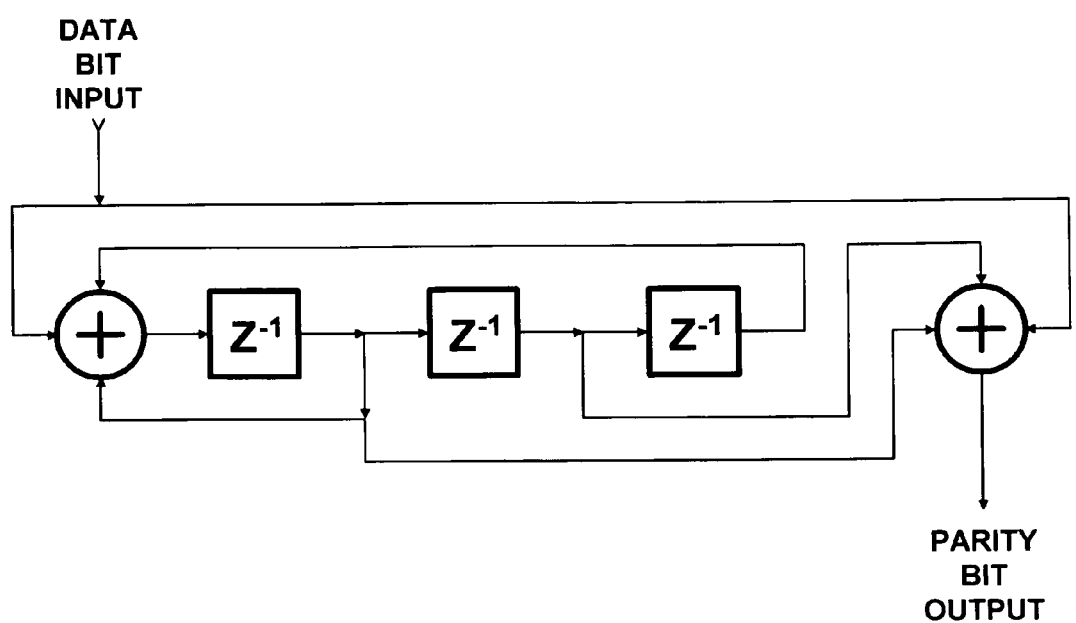
FIG. 5 is a schematic diagram of a constituent encoder of a type suitable for use in the turbo post-processor depicted in FIG. 4.

FIG. 5 shows the constituent encoder used in A-VSB for generating parity bits of half-rate outer convolutional coding. The "later" RSC code encoder 16-3 and the "earlier" RSC code encoder 16-5 in the FIG. 4 turbo post-processor 16-0 can each simply consist of a respective constituent encoder as depicted in FIG. 5. The turbo post-processor 16 in FIG. 1 transmitter apparatus used for staggercasting SCCC differs in the following way from the turbo post-processor 16-0 used for "punctured" staggercasting SCCC. The elements 16-3, 16-4, 16-5, 16-6 and 16-7 are replaced by a single FIG. 5 constituent encoder connected to receive the selection circuitry 16-1 response and to supply parity bits to the outer convolutional code bit interleaver 16-9.

Figure 6:
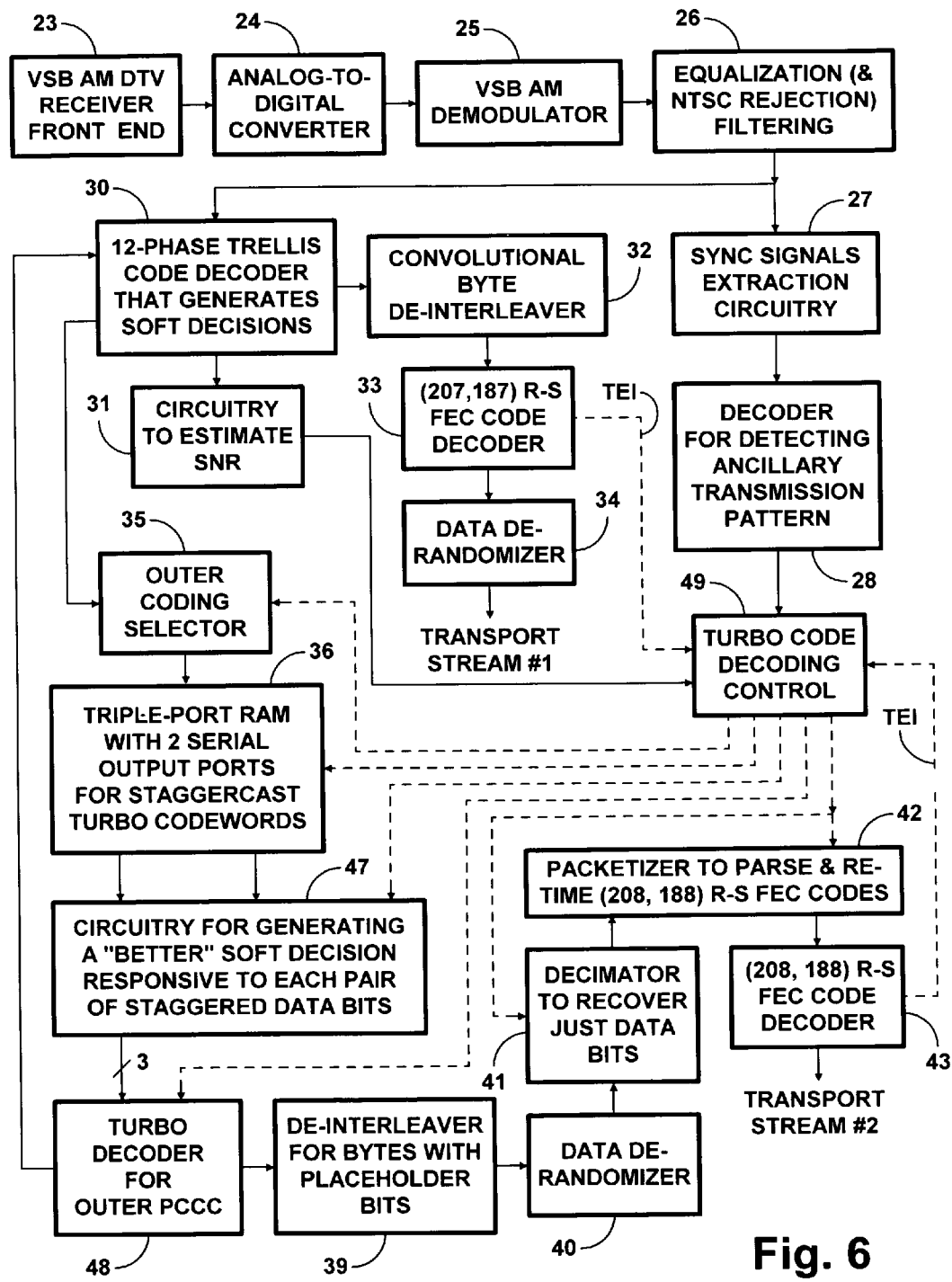
FIG. 6 is a schematic diagram of DTV receiver apparatus for usefully receiving signals as transmitted by the modification of the FIG. 1 DTV transmitter apparatus to include the FIG. 3 turbo post-processor, which receiver apparatus embodies an aspect of the invention.

FIG. 6 shows DTV receiver apparatus for usefully receiving "punctured" staggercast SCCC signals as transmitted by the FIG. 1 DTV transmitter apparatus as modified to include the FIG. 4 turbo post-processor 16-0. The FIG. 6 DTV receiver apparatus differs from that of FIG. 2 in the following respects. The circuitry 37 for generating a "better" soft decision responsive to each pair of "soft" decisions supplied thereto is replaced by circuitry 47 for generating "better" soft decisions just for data bits, which are repeated, and not for parity bits, which are not repeated. The decoder 38 for outer convolutional coding is replaced by a decoder 48 for outer parallel concatenated convolutional coding. The turbo code decoding control circuitry 29 is replaced by turbo code decoding control circuitry 49 that generates suitable control signals for the circuitry 47 and the decoder 48 for outer PCCC. The turbo code decoding control circuitry 49 also generates suitable control signals for other elements in the FIG. 6 receiver apparatus similar to those in the FIG. 2 receiver apparatus. The turbo code decoding control circuitry 49 uses the estimated SNR supplied by the circuitry 31 to determine the maximum number of iterations to be used when decoding each turbo codeword.

In FIG. 6 the first and second serial output ports of the memory 36 respectively connect to first and second input ports of the circuitry 47 for generating a "better" soft decision responsive to each pair of "soft" decisions concerning data bits that are concurrently read thereto from the memory 36. The circuitry 47 compares each pair of concurrent "soft" decisions concerning data bits that are read thereto. The "better" one of the "soft" decisions is selected for application to a first output port of the circuitry 47. The "better" of the concurrent "soft" decisions is the one with greater probability of being correct. If two concurrent "soft" decisions have equal probability of being correct, a prescribed one of the pair is selected by default as the "better" decision. In more sophisticated designs of the circuitry 47, the probability of error in the selected "soft" decision is adjusted according to the degree of agreement or disagreement of the two concurrent "soft" decisions. These adjustments can be made referring to look-up tables stored in read-only memory. The "earlier" set of parity bytes supplied from the RAM 36 to the circuitry 47 is forwarded to a second output port of the circuitry 47. The "later" set of parity bytes supplied from the RAM 36 to the circuitry 47 is forwarded to a third output port of the circuitry 47. The turbo decoder 48 for outer PCCC is connected for receiving each set of data bytes and the two corresponding sets of parity bytes from the first, second and third ports of the circuitry 47. FIG. 6 shows the turbo decoder 48 connected for supplying its decoding results to the de-interleaver 39.

FIG. 6 also shows a connection for feeding decoding results from the turbo decoder 48 for outer PCCC back to the trellis decoder 30. This allows the extraction of extrinsic information that the trellis decoder 30 can use for SCCC turbo decoding. The SCCC turbo decoding may benefit trellis decoding for ordinary 8VSB as well as for SCCC.

Figure 7:
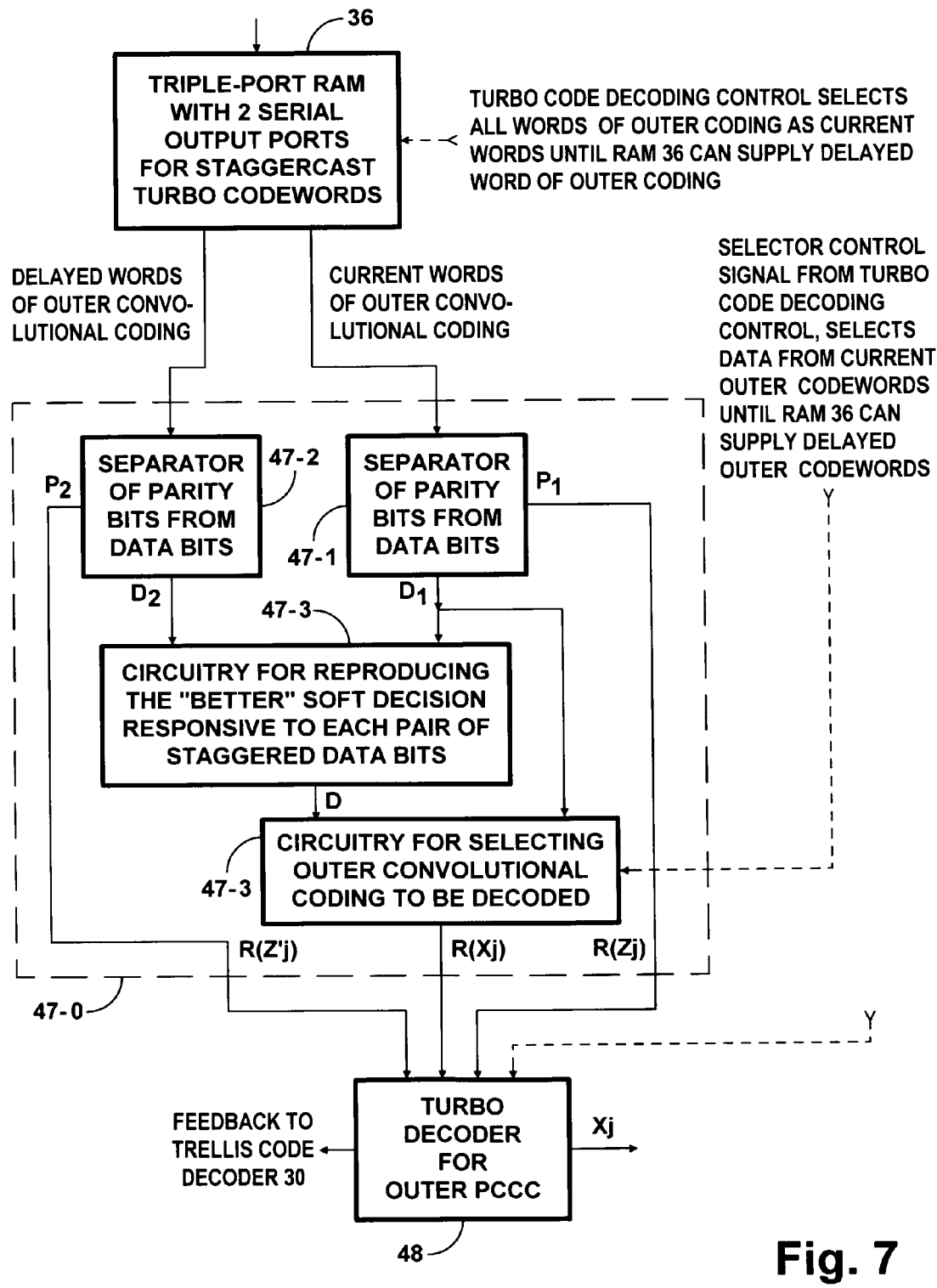
FIG. 7 is a schematic diagram of circuitry used in the FIG. 6 DTV receiver apparatus to facilitate acquisition of "punctured" staggercast DTV signals during power-up or after a channel change.

FIG. 7 shows in more detail a particular embodiment 47-0 of the circuitry 47 used in the FIG. 6 DTV receiver apparatus, which circuitry 47-0 is designed to facilitate acquisition of "punctured" staggercast DTV signals during power-up or after a channel change. The circuitry 47-0 includes separator 47-1 circuitry connected for separating "soft" decisions concerning the first set $P_1$ of parity bits from the "soft" decisions concerning the first set $D_1$ of data bits in each current RSC codeword supplied to the separator 47-1 from the RAM 36. The circuitry 47-0 further includes separator 47-2 circuitry connected for separating "soft" decisions concerning the second set $P_2$ of parity bits from "soft" decisions concerning the second set $D_2$ of data bits in each delayed RSC codeword supplied to the separator 47-1 from the RAM 36. The separated "soft" decisions concerning the first set $P_1$ of parity bits and the separated "soft" decisions concerning the second set $P_2$ of parity bits are supplied in parallel to the turbo decoder 48 for PCCC. The "soft" decisions concerning the first set $P_1$ of parity bits are supplied in LLR form to the basic architecture of the decoder 48 as an input signal $R(Z_j)$. The "soft" decisions concerning the second set $P_2$ of parity bits are supplied in LLR form to the basic architecture of the decoder 48 as an input signal $R(Z'_j)$.

The circuitry 47-0 also includes circuitry 47-3 connected for comparing corresponding ones of the "soft" decisions concerning each first set $D_1$ of data bits and the "soft" decisions concerning the second set $D_2$ of data bits. The circuitry 47-3 operates to reproduce the "better" one of each pair of "soft" decisions concerning each data bit of the outer RSC code included in the "punctured" staggered transmissions, thereby generating "soft" decisions concerning an idealized third set D of data bits. The circuitry 47-3 is capable of such selective reproduction only after the RAM 36 is able to supply valid delayed outer RSC codewords, which the RAM 36 cannot do for some time after power-up or a channel change.

The circuitry 47-0 also includes circuitry 47-4 connected for responding to control signal it receives from the turbo decoding control circuitry 49 to select the "soft" decisions concerning the data bits of outer RSC codewords that the circuitry 47-4 reproduces in its response. These "soft" decisions concerning the data bits of outer RSC codewords are supplied in LLR form to the basic architecture of the decoder 48 as an input signal $R(X_j)$. Until the RAM 36 can supply valid delayed outer convolutional codewords, the control signal applied to the circuitry 47-4 conditions the circuitry 47-4 to reproduce the "soft" decisions concerning the first set $D_1$ of data bits that the separator 47-1 separates from the current words of outer RSC code. When the RAM 36 is subsequently able to supply valid delayed outer convolutional codewords, the control signal applied to the circuitry 47-4 conditions the circuitry 47-4 to reproduce the circuitry 47-3 response composed of "soft" decisions concerning the idealized third set D of data bits.

Figure 8:
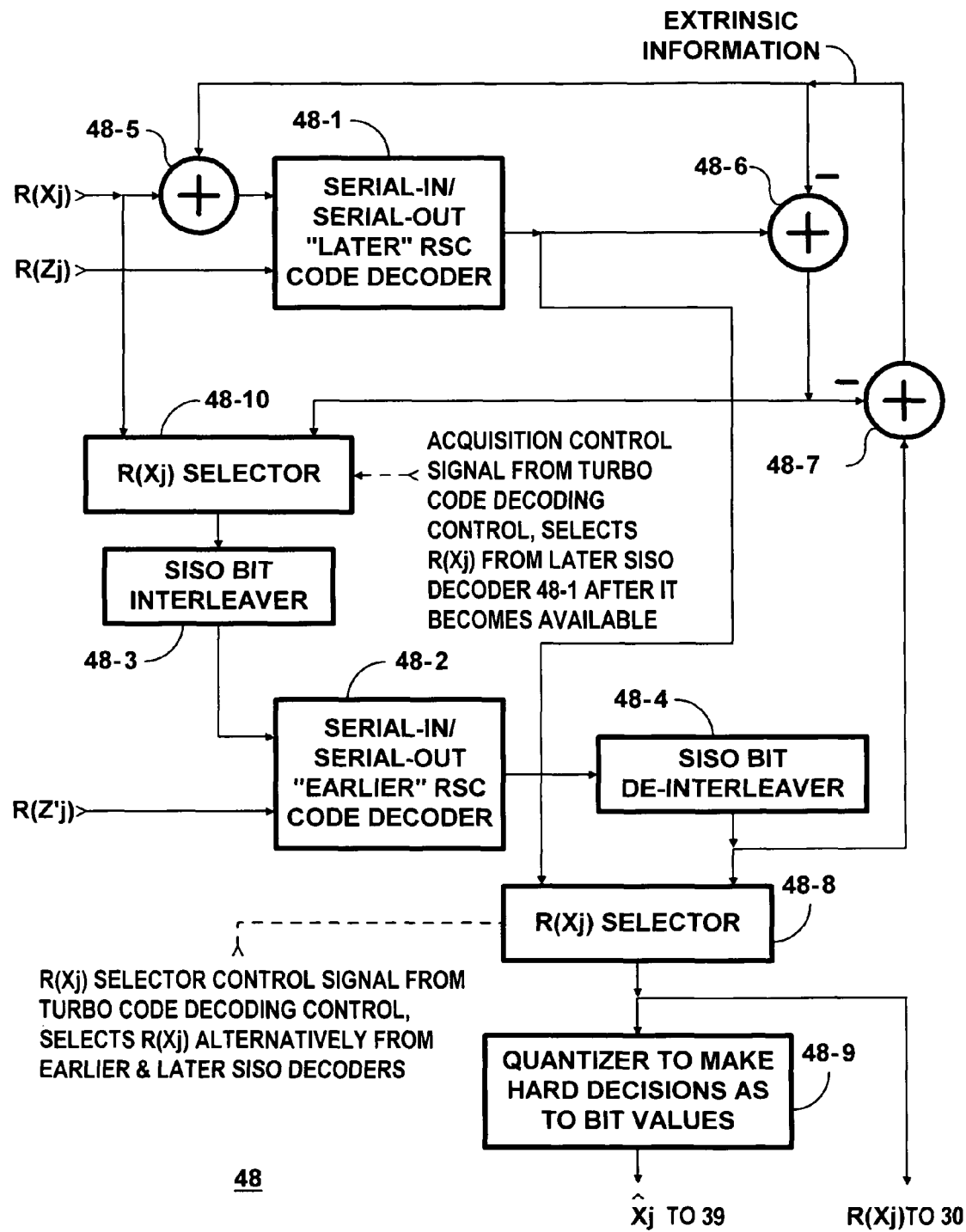
FIG. 8 is a schematic diagram of a turbo decoder used in the FIG. 6 DTV receiver apparatus.

FIG. 8 shows the basic architecture 48-0 within the PCCC decoder 48. The basic architecture 48-0 includes a "later" soft-input/soft-output decoder 48-1, an "earlier" soft-input/soft-output decoder 48-2, a soft-input/soft-output interleaver 48-3, a soft-input/soft-output de-interleaver 48-4, and (signed) two-input adders 48-5, 48-6 and 48-7. The basic architecture 48-0 further includes a selector 48-8 for selecting soft-decisions concerning the values of data bits in the response of the one of the soft-input/soft-output decoders 48-1 and 48-2 selected to be fed back to the trellis code decoder 30. The basic architecture 48-0 also includes a quantizer 48-9 for making "hard" decisions concerning the values of those bits to be fed forward to the input port of the de-interleaver 39. FIG. 8 shows the basic architecture 48-0 to further include a selector 48-10 for selecting "soft" decisions concerning the values of data bits to the interleaver 48-3. FIG. 8 does not explicitly show the buffer memories that are included in many of the interconnections between elements of the basic architecture 48-0, which buffer memories are customarily omitted in diagrams of PCCC decoder architecture.

The SISO decoders 48-1 and 48-2 may employ the soft-output Viterbi algorithm (SOVA) or the maximum a posteriori (MAP) algorithm. The MAP algorithm is more complex than SOVA, but performs better. The MAP algorithm is more easily performed in the logarithmic regime, so that multiplications become simple additions in the SISO decoders 48-1 and 48-2. The adders 48-5, 48-6 and 48-7 accordingly operate in the logarithmic regime. It is known to implement addition in the logarithmic regime simply by taking the maximum of the arguments of the two summands and then adding a correction function the argument of which depends only on the magnitude of the difference between the two arguments. The correction function is customarily pre-computed and stored in a lookup table.

The three soft-decision components of PCCC supplied from the circuitry 47 shown in FIG. 8 for application to this basic architecture 48-0 as input signals are probabilistic expressions referred to as "log-likelihood ratios" (LLRs), which facilitate the MAP algorithm. They comprise an LLR $R(X_j)$ for each data bit, an LLR $R(Z_j)$ for each parity bit in the "late" set of parity bits, and an LLR $R(Z'_j)$ for each parity bit in the "early" set of parity bits. The LLRs subsequently computed by the SISO decoders 48-1 and 48-2 compare the probability that each particular data bit was a ONE versus the probability that it was a ZERO, considering "soft" decisions as to other bits of the received turbo codeword.

The soft-decisions as to data bits supplied to the PCCC decoder 48 as converted to LLR form $R(X_j)$ are supplied as one of two summand input signals to the adder 48-5, to be additively combined with the other of the two summand input signals consisting of extrinsic information fed back from any previous decoding procedure the "earlier" SISO decoder 48-2 performed on the same turbo codeword. The adder 48-5 is connected for supplying the sum output signal therefrom to an upper input port of the "later" soft-input/soft-output decoder 48-1. A lower input port of the "later" SISO decoder 48-1 is connected for receiving the first set of parity code soft-decisions $R(Z_j)$ as converted to LLR form.

The SISO decoders 48-1 and 48-2 operate at different times. The "later" SISO decoder 48-1 operates during the initial half of each performance of the turbo PCCC decoding procedure. Subsequently the "earlier" SISO decoder 48-2 operates during the final half of that performance of the turbo PCCC decoding procedure. When decoding of a fresh PCCC word commences, there is no extrinsic information fed back from the SISO decoder 48-2 to the adder 48-5, so the adder 48-5 supplies $R(X_j)$ as its sum signal to the SISO decoder 48-1. The SISO decoder 48-1 operates during the initial half of the first performance of the turbo decoding procedure on a current turbo codeword to generate an LLR comparing the probability that each particular data bit in $R(X_X)$ was a ONE versus the probability that it was a ZERO, considering the "soft" decisions in $R(X_j)$ and in $R(Z_j)$. This LLR, generated without dependency on extrinsic information, is supplied as minuend to the signed adder 48-6 operated as a subtractor, which is connected to receive the extrinsic information as subtrahend input signal. The difference signal supplied from the output port of the signed adder 48-6 is a revised LLR comparing the probability that each particular data bit was a ONE versus the probability that it was a ZERO, which revised LLR has no dependency on extrinsic information.

The output port of the signed adder 48-6 is connected for supplying this difference signal to one of the input ports of the selector 48-10 for selecting soft-decisions concerning the values of data bits to the input port of the SISO interleaver 48-3. An acquisition control signal from the turbo decoding control circuitry 49 (or 61 or 74) controls which of two input signals supplied to the selector 48-10 is reproduced in its response supplied to the input port of the SISO interleaver 48-3. During ordinary operation the acquisition control signal conditions the selector 48-10 to reproduce the difference signal supplied from the output port of the signed adder 48-6 for application to the input port of the SISO interleaver 48-3. During power-up or after a channel change, the SISO decoder 48-1 may be unable to provide soft-decisions concerning the values of data bits. So, during the acquisition of "punctured" staggercast DTV signals after power-up or a channel change, the acquisition control signal conditions the selector 48-10 to reproduce the $R(X_j)$ signal supplied from the circuitry 47 to the adder 48-5. This allows decoding by the SISO decoder 48-2 to go forward before decoding by the SISO decoder 48-1 if necessary to speed the acquisition of "punctured" staggercast DTV signals after power-up or a channel change.

The permutation pattern of the SISO interleaver 48-3 is similar to the permutation pattern of the ancillary-data bit interleaver 16-4 used in the FIG. 4 turbo post-processor 16-0. An upper input port of the "earlier" SISO decoder 48-2 is connected for receiving the bit-interleaved "soft" decisions in LLR form concerning the data bits of a turbo codeword supplied as the SISO interleaver 48-3 response. A lower input port of the "earlier" SISO decoder 48-2 is connected for receiving the second set of parity code soft-decisions $R(Z'_j)$ as converted to LLR form.

The output port of the SISO interleaver 48-3 is connected for supplying its interleaved response to the revised LLR to an upper input port of the "earlier" soft-input/soft-output decoder 48-2. The "earlier" SISO decoder 48-2 then operates during the final half of the first performance of the turbo decoding procedure on the current turbo codeword, responsive to the bit interleaver 48-3 response received at its earlier input port and to the second set of parity code soft-decisions $R(Z'_j)$ received at its lower input port. The SISO decoder 48-2 generates a further revised LLR supplied from an output port thereof connected to the input port of the SISO de-interleaver 48-4. The response from the output port of the SISO de-interleaver 48-4 re-arranges the "soft" decisions of this further revised LLR to an order corresponding to the order of "soft" decisions in the revised LLR supplied as difference signal from the output port of the signed adder 48-6. The signed adder 48-7 is operated as a subtractor, one of its input ports being connected to receive as minuend input signal the further revised LLR from the output port of the SISO de-interleaver 48-4. The other input port of the signed adder 48-7 is connected to receive as subtrahend input signal the revised LLR from the output port of the signed adder 48-6. The difference signal supplied from the output port of the signed adder 48-7 is the extrinsic information for the subsequent cycle of the turbo decoding procedure, if such there is to be.

FIG. 8 shows the basic architecture 48-0 of the decoder 48 further including the time-division multiplexer 48-8, which has its output port connected to the input port of a quantizer 48-9 for making "hard" decisions as to each of the bits in a recovered (208, 188) R-S FEC codeword. One of the two input ports of the multiplexer 48-8 is connected for receiving the de-interleaved further revised LLR from the output port of the SISO de-interleaver 48-4, but the other input port of the multiplexer 48-8 is connected for receiving the LLR computed by the "later" SISO decoder 48-1. This latter connection permits the PCCC decoding control circuitry 49 to discontinue the processing of a current PCCC word by the decoder 48 halfway through a complete cycle of turbo decoding procedure. The output port of the quantizer 48-8 is connected to supply recovered R-S FEC codeword the input port of the de-interleaver 39 shown in FIG. 7.

In each iteration of turbo decoding procedure on the current PCCC word, the extrinsic information supplied from the output port of the signed adder 48-7 during the preceding performance of the turbo decoding procedure on the current PCCC word is added to $R(X_j)$ by the adder 48-5 and applied to the earlier input port of the "later" soft-input/soft-output decoder 48-1. The SISO decoder 48-1 operates during the initial half of each iteration of the turbo decoding procedure on a current PCCC word to generate an LLR comparing the probability that each particular data bit in $R(X_j)$ was a ONE versus the probability that it was a ZERO, considering the "soft" decisions in $R(X_j)$ as updated by the extrinsic information from the preceding performance of the turbo decoding procedure on the current PCCC word, and considering the "soft" decisions in $R(Z_j)$. This LLR is supplied via the multiplexer 48-8 to the quantizer 48-9.

The LLR that the "later" SISO decoder 48-1 generates has some dependency on extrinsic information. This LLR is also supplied as minuend to the signed adder 48-6 operated as a subtractor and connected to receive the extrinsic information as subtrahend input signal. The difference signal supplied from the output port of the signed adder 48-6 is a currently revised LLR comparing the probability that each particular data bit was a ONE versus the probability that it was a ZERO. This currently revised LLR has its dependency on extrinsic information from the "earlier" SISO decoder 48-2 suppressed. The output port of the signed adder 48-6 is connected for supplying this difference signal to one of the input ports of the selector 48-10, which reproduces this difference signal for application to the input port of the SISO interleaver 48-3.

The output port of the SISO interleaver 48-3 is connected for supplying its interleaved response to the currently revised LLR to an upper input port of the "earlier" soft-input/soft-output decoder 48-2. The "later" SISO decoder 48-2 then operates during the final half of the iterated turbo decoding procedure on the current turbo codeword, responsive to the bit interleaver 48-3 response received at its upper input port and to the second set of parity code soft-decisions $R(Z'_j)$ received at its lower input port. The SISO decoder 48-2 generates a currently further revised LLR supplied from an output port thereof connected to the input port of the bit de-interleaver 48-4. The response from the output port of the SISO de-interleaver 48-4 re-arranges the "soft" decisions of this currently further revised LLR to an order corresponding to the order of "soft" decisions in the currently revised LLR supplied as difference signal from the output port of the signed adder 48-6. The signed adder 48-7 is operated as a subtractor, receiving the currently further revised LLR from the output port of the SISO de-interleaver 48-4 as minuend input signal, and receiving the currently revised LLR from the output port of the signed adder 48-6 as subtrahend input signal. The difference signal supplied from the output port of the signed adder 48-7 is the extrinsic information for the subsequent iteration of the turbo decoding procedure, if such there is to be.

Figure 9:
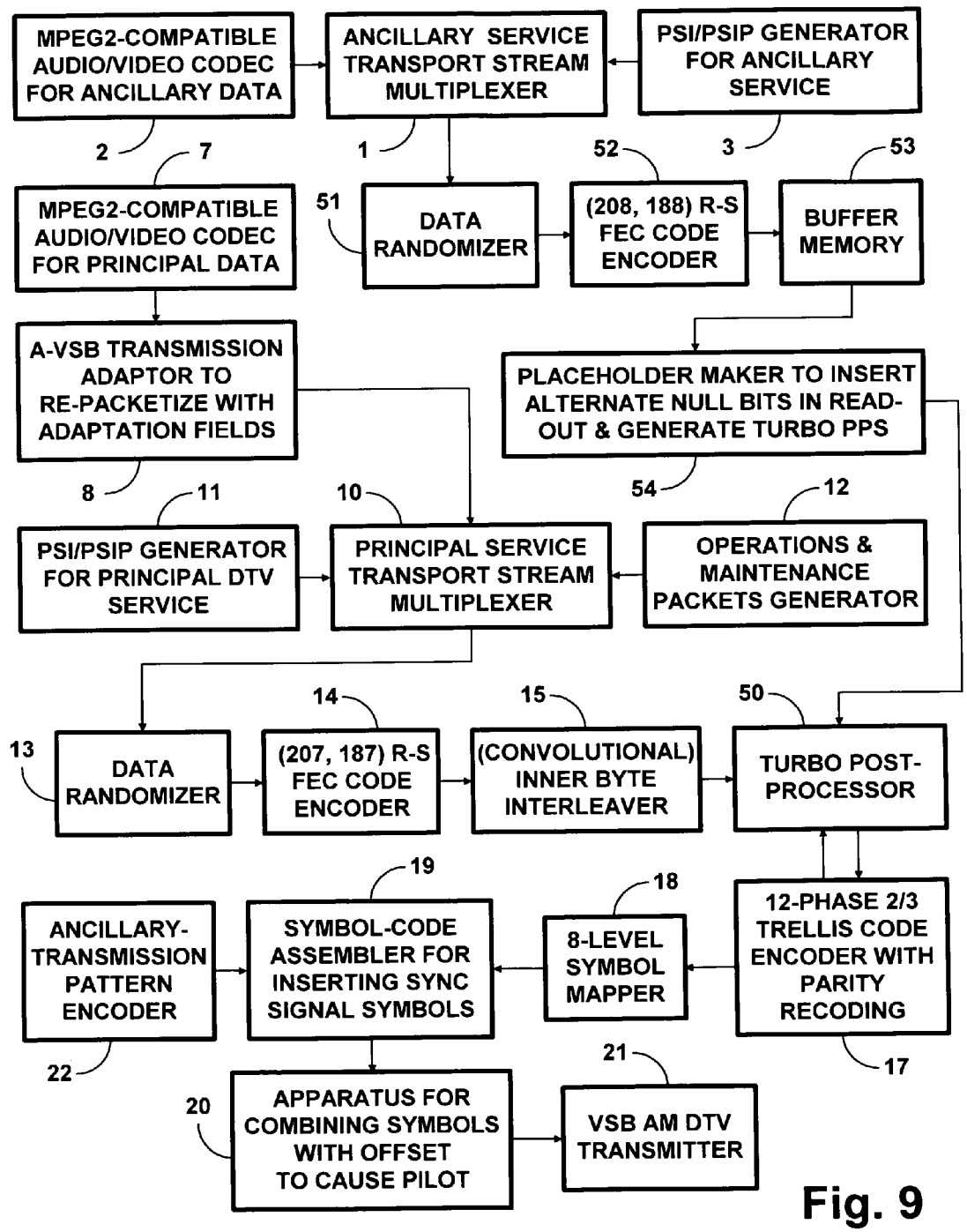
FIG. 9 is a schematic diagram 8VSB DTV transmitter apparatus of a second type, which transmitter apparatus is modified in accordance with an aspect of the invention to provide for staggercasting of SCCC words.

FIG. 9 shows 8VSB DTV transmitter apparatus of a second type, which apparatus is similar to the 8VSB DTV transmitter apparatus of first type shown FIG. 1 except for the ways in which turbo pre-processing and turbo post-processing are done. Turbo pre-processing and turbo post-processing are done in a way that simplifies the de-randomization of ancillary data recovered by turbo decoding in DTV receiver apparatuses. The adaptation field stuffer 9 of the FIG. 1 transmitter apparatus is absent from the FIG. 9 transmitter apparatus. Instead, the MPEG-2-compatible packets with adaptation fields that the A-VSB transmission adaptor 8 generates at times are supplied from its output port directly to an input port of the principal-service transport-stream multiplexer 10. The data randomizer 13, the input port of which is connected for receiving data from the multiplexer 10 output port, randomizes placeholder bits in the adaptation fields of these MPEG-2-compatible packets. However, the data randomizer 13 does not affect the bits that will subsequently replace the randomized placeholder bits in these adaptation fields. This replacement takes place within a turbo post-processor 50 in the second type of 8VSB DTV transmitter apparatus shown FIG. 9, which turbo post-processor 50 replaces the turbo post-processor 16 of the first type of 8VSB DTV transmitter apparatus shown FIG. 1.

In the FIG. 9 transmitter apparatus also, the ancillary-service transport-stream multiplexer 1 is connected for receiving 187-byte MPEG-2-compatible data packets supplied to respective input ports thereof from the output port of the audio/video codec 2 and from the output port of the PSI/PSIP generator 3. The FIG. 9 transmitter apparatus does not include the cascade connection of R-S FEC code encoder 4, placeholder maker 5 and buffer memory 6 included in the FIG. 1 transmitter apparatus and supplied the ancillary-service transport stream from the output port of the multiplexer 1. In the FIG. 9 transmitter apparatus the output port of the multiplexer 1 is connected for supplying the ancillary-service transport stream to the input port of a data randomizer 51. By way of example, the data randomizer 13 exclusive-ORs the MPEG-2-compatible data packets in the ancillary transport stream assembled by the multiplexer 1 with portions of the PRBS prescribed in A/53, Annex D, §4.2.2 titled "Data randomizer". The PRBS is timed to begin at the start of ancillary data fields. The data randomizer 51 generates 187-byte data packets of randomized response to the ancillary-service transport stream. The output port of the data randomizer 51 is connected for supplying these 187-byte packets of randomized data to the input port of an encoder 52 for (208, 188) Reed-Solomon forward-error-correction coding. Data randomization of the MPEG-2-compatible data packets improves the performance of the encoder 52 by reducing the likelihood of long runs of ZEROes in its input signal. The output port of the encoder 52 is connected for supplying (208, 188) R-S FEC codewords for writing to a buffer memory 53. In actual practice the encoder 52 and the buffer memory 53 may share components providing temporary storage. A placeholder maker 54 is connected for inserting a respective a respective null bit after each data bit read from the buffer memory 53, as supplied to the turbo post-processor 50 for replacing placeholder bits in the adaptation fields of data packets.

Figure 10:
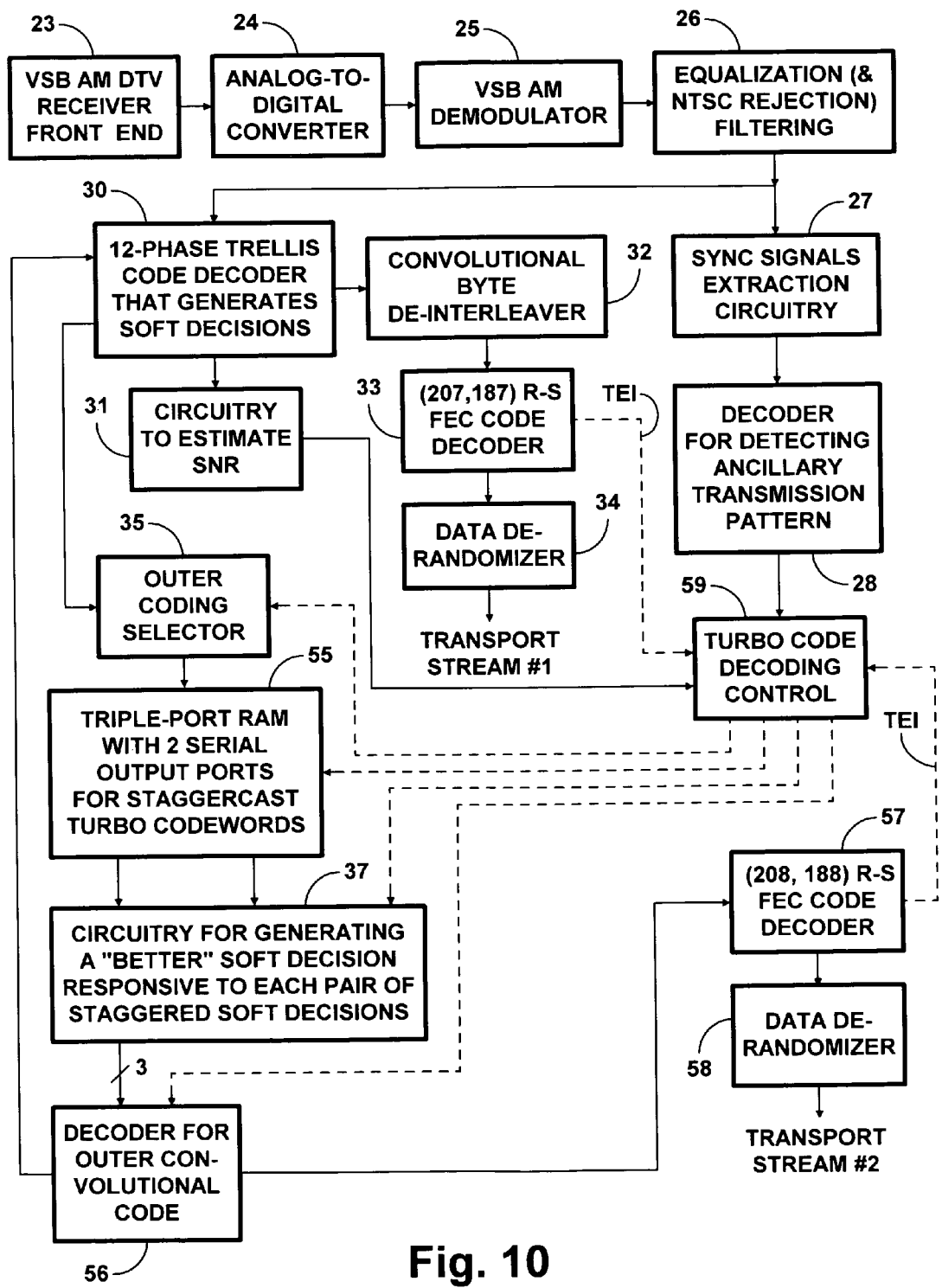
FIG. 10 is a schematic diagram of DTV receiver apparatus for usefully receiving signals as transmitted by the FIG. 9 DTV transmitter apparatus, which receiver apparatus embodies an aspect of the invention.

FIG. 10 shows DTV receiver apparatus for usefully receiving signals as transmitted by the FIG. 9 DTV transmitter apparatus of second type. These DTV signals differ from those transmitted by the FIG. 1 DTV transmitter apparatus of first type in that the data bits submitted for turbo coding have not been subjected to interleaving by the convolutional byte interleaver 15. Accordingly, the DTV receiver apparatus shown in FIG. 10 is similar to that shown in FIG. 2 except in the following regards.

The triple-port RAM 36 of the FIG. 2 DTV receiver apparatus is replaced in the FIG. 10 DTV receiver apparatus by a triple-port random-access memory 55. In the RAM 55 the shift registers for supplying the current and delayed portions of the staggercast outer convolutional coding to respective serial output ports are configured differently for parallel loading than in the RAM 36. In the RAM 55 the parallel loading of these shift registers takes into account the fact that the data bits submitted for turbo coding in the FIG. 9 DTV transmitter apparatus have not been subjected to interleaving by the convolutional byte interleaver 15.

The decoder 38 for outer convolutional coding of the FIG. 2 DTV receiver apparatus is replaced in the FIG. 10 DTV receiver apparatus by a decoder 56 for outer convolutional coding. FIG. 10 shows a connection for feeding decoding results from the decoder 56 back to the trellis decoder 30. This allows the extraction of extrinsic information that the trellis decoder 30 can use for SCCC turbo decoding.

The decoder 56 differs from the decoder 38 to take into account that the bit interleaver for outer convolutional coding may differ in the DTV transmitter apparatuses of different types. The decoded data supplied from the decoder 56 does not have to be de-interleaved to compensate for interleaving of the outer convolutional coding by the convolutional byte interleaver 15 in the DTV transmitter apparatus. So, the FIG. 10 DTV receiver apparatus replaces the cascaded elements 39, 40, 41, 42 and 43 used in the FIG. 2 DTV receiver apparatus with just a decoder 57 for (208, 188) Reed-Solomon forward-error-correction coding, followed by a data de-randomizer 58. More specifically, the output port of the decoder 56 for outer convolutional coding that supplies "hard" decisions on data is connected to the input port of the R-S decoder 57. The output port of the R-S decoder 57 is connected for supplying 187-byte packets of randomized data to the data de-randomizer 58. The data de-randomizer 58 undoes the data randomization performed by the data randomizer 51 in the FIG. 9 DTV transmitter apparatus of second type. The data de-randomizer 58 reproduces at its output port the MPEG-2-compatible data packets of the ancillary data transport stream, which FIG. 10 shows as being a second transport stream.

The FIG. 10 DTV receiver apparatus includes turbo code decoding control circuitry 59 that responds to the ancillary transmission pattern decoded by the decoder 28 and replaces the turbo code decoding control circuitry 29 of the FIG. 2 DTV receiver apparatus. The turbo code decoding control circuitry 59 uses the estimated SNR supplied by the circuitry 31 to determine the maximum number of iterations to be used when decoding each turbo codeword. The R-S decoder 57 is further connected for supplying the turbo code decoding control circuitry 59 indications of byte errors in the 187-byte packets of ancillary data. If all the packets of ancillary data reproduced by decoding a turbo codeword are free of remaining byte error, the turbo code decoding control circuitry 59 can stop further decoding of the turbo codeword. The turbo code decoding control circuitry 59 uses this information to control the filling of subsequent buffer memory written from the second transport stream. FIG. 10 does not show this subsequent buffer memory.

Figure 11:
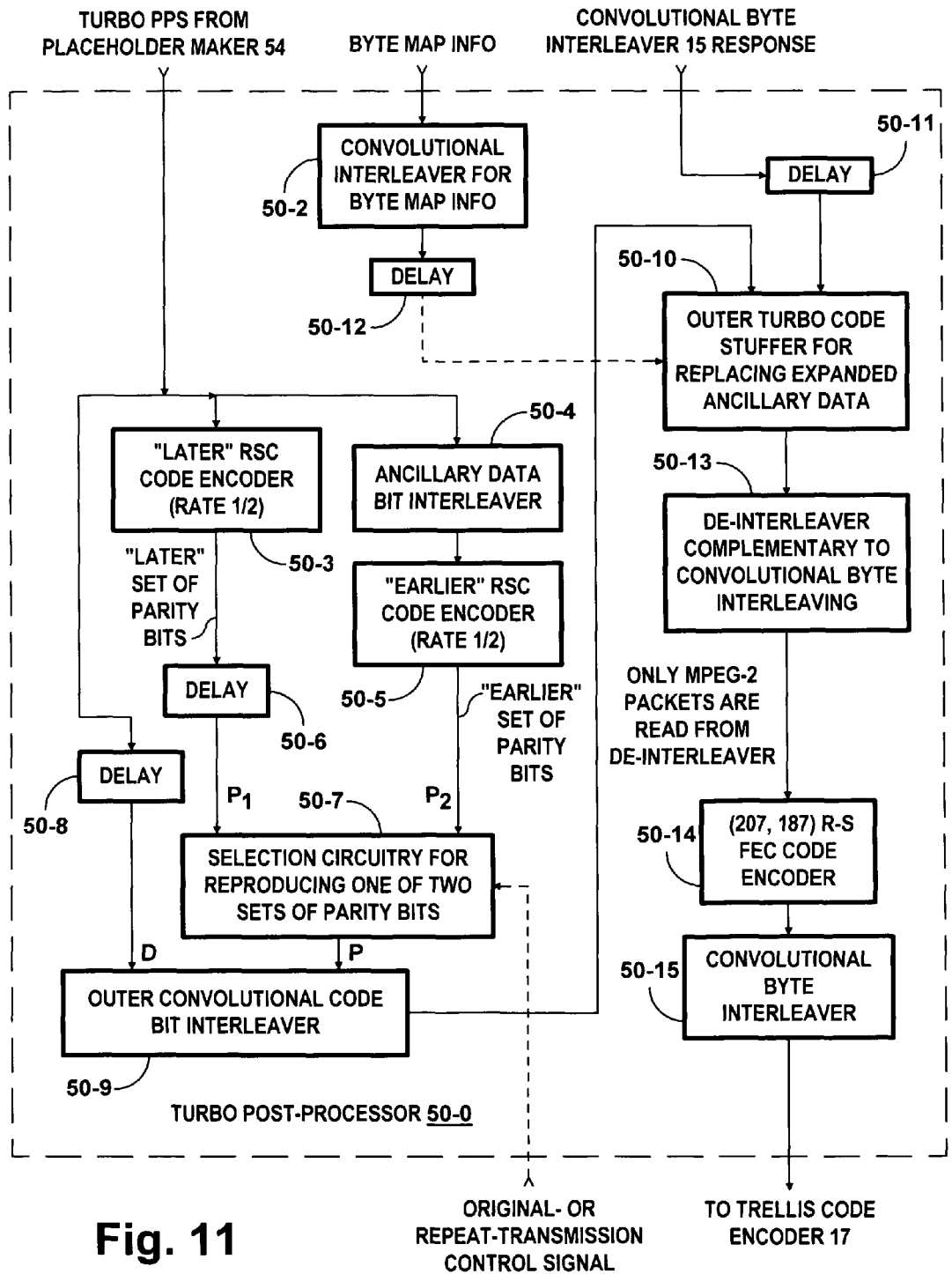
FIG. 11 is a schematic diagram of a turbo post-processor of novel type included in a modification of the FIG. 9 DTV transmitter apparatus to provide for "punctured" staggercasting of SCCC words.

FIG. 11 shows a turbo post-processor 50-0 of novel type replacing the turbo post-processor 50 in a modification of the FIG. 9 DTV transmitter apparatus that provides for "punctured" staggercasting of SCCC words. The turbo post-processor 50-0 includes elements 50-2 through 50-15 similar to elements 16-2 through 16-15 respectively in the turbo post-processor 16-0 shown in FIG. 4. The turbo post-processor 50-0 differs from the turbo post-processor 16-0 in not having an element corresponding to the selection circuitry 16-1 for extracting expanded ancillary data from other data in the convolutional byte interleaver 15 response. Instead, the turbo pre-processor stream from the FIG. 9 placeholder maker 54 is applied to the respective input ports of the "later" RSC code encoder 50-3, the ancillary-data bit interleaver 50-4 and the delay 50-8.

The turbo post-processor 50 in FIG. 9 transmitter apparatus used for staggercasting SCCC differs in the following way from the turbo post-processor 50-0 used for "punctured" staggercasting SCCC. The elements 50-3, 50-4, 50-5, 50-6 and 50-7 are replaced by a single FIG. 5 constituent encoder connected to receive the turbo pre-processor stream from the FIG. 9 placeholder maker 54 and to supply parity bits to the outer convolutional code bit interleaver 50-9.

Figure 12:
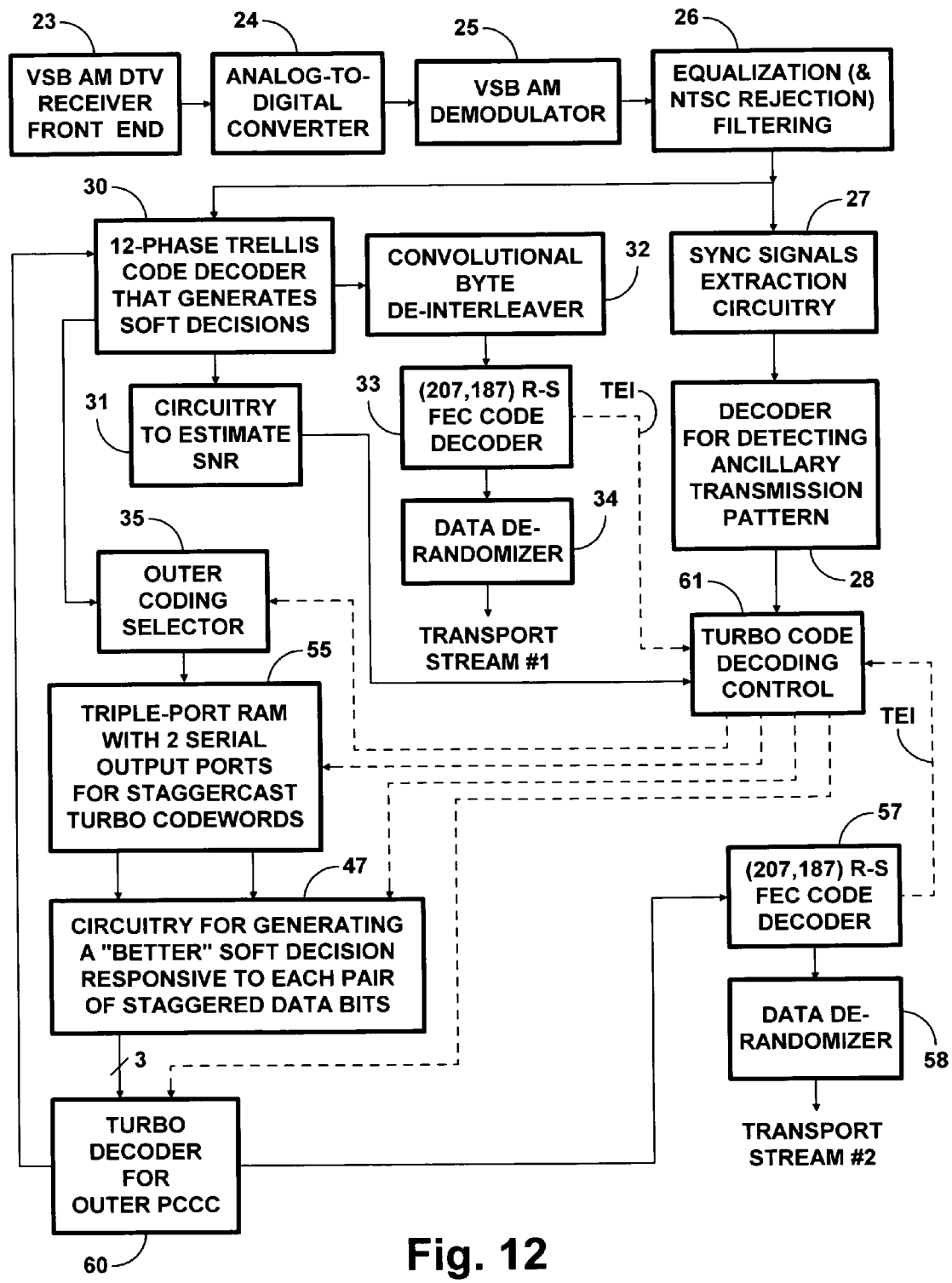
FIG. 12 is a schematic diagram of DTV receiver apparatus for usefully receiving signals as transmitted by the modification of the FIG. 9 DTV transmitter apparatus to include the FIG. 11 turbo post-processor, which receiver apparatus embodies an aspect of the invention.

FIG. 12 shows DTV receiver apparatus for usefully receiving "punctured" staggercast SCCC signals as transmitted by the FIG. 9 DTV transmitter apparatus as modified to include the FIG. 11 turbo post-processor 50-0. The FIG. 12 DTV receiver apparatus differs from that of FIG. 10 in the following respects. The circuitry 37 for generating a "better" soft decision responsive to each pair of "soft" decisions supplied thereto is replaced by circuitry 47 for generating "better" soft decisions just for data bits, which are repeated, and not for parity bits, which are not repeated. The decoder 56 for outer convolutional coding is replaced by a decoder 60 for outer parallel concatenated convolutional coding (PCCC). The turbo code decoding control circuitry 59 is replaced by turbo code decoding control circuitry 61 that generates suitable control signals for the circuitry 47 and the decoder 60 for outer PCCC. The turbo code decoding control circuitry 61 also generates suitable control signals for other elements in the FIG. 12 receiver apparatus similar to those in the FIG. 10 receiver apparatus. The turbo code decoding control circuitry 61 uses the estimated SNR supplied by the circuitry 31 to determine the maximum number of iterations to be used when decoding each turbo codeword.

In FIG. 12 the first and second serial output ports of the memory 55 respectively connect to first and second input ports of the circuitry 47 for generating a "better" soft decision responsive to each pair of "soft" decisions concerning data bits that are concurrently read thereto from the memory 55. The circuitry 47 compares each pair of concurrent "soft" decisions concerning data bits that are read thereto. The "better" one of the "soft" decisions is selected for application to a first output port of the circuitry 47. The "better" of the concurrent "soft" decisions is the one with greater probability of being correct. If two concurrent "soft" decisions have equal probability of being correct, a prescribed one of the pair is selected by default as the "better" decision. In more sophisticated designs of the circuitry 47, the probability of error in the selected "soft" decision is adjusted according to the degree of agreement or disagreement of the two concurrent "soft" decisions. These adjustments can be made referring to look-up tables stored in read-only memory. The "earlier" set of parity bytes supplied from the RAM 55 to the circuitry 47 is forwarded to a second output port of the circuitry 47. The "later" set of parity bytes supplied from the RAM 55 to the circuitry 47 is forwarded to a third output port of the circuitry 47. The turbo decoder 60 for outer PCCC is connected for receiving each set of data bytes and the two corresponding sets of parity bytes from the first, second and third ports of the circuitry 47. FIG. 12 shows the turbo decoder 60 for outer PCCC connected for supplying its decoding results to the decoder 57 for (208, 188) R-S FEC codewords, which codewords are reproduced in the decoding results from the turbo decoder 60.

FIG. 12 also shows a connection for feeding decoding results from the turbo decoder 60 for outer PCCC back to the trellis decoder 30. This allows the extraction of extrinsic information that the trellis decoder 30 can use for SCCC turbo decoding. The SCCC turbo decoding may benefit trellis decoding for ordinary 8VSB as well as for SCCC.

Figure 13:
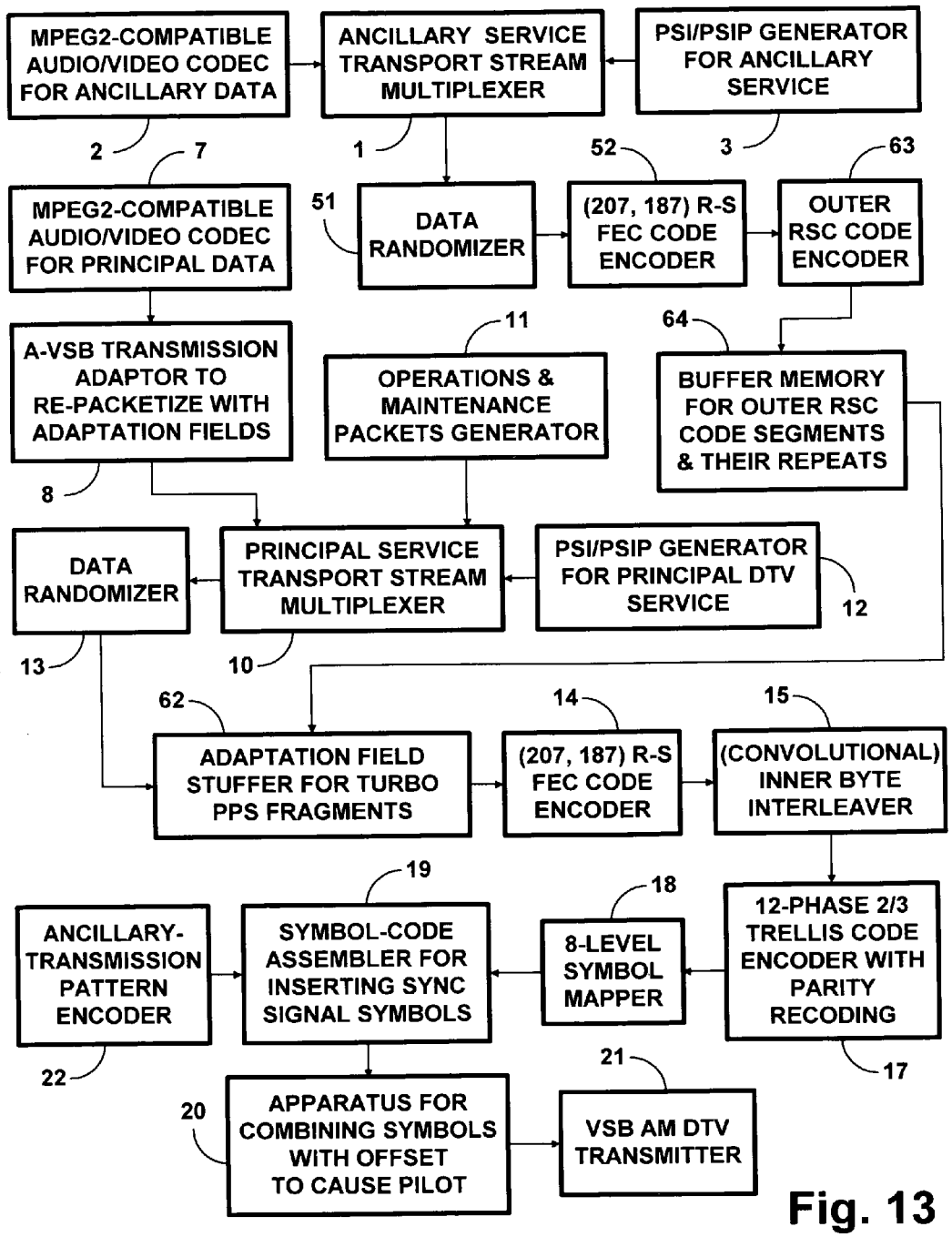
FIG. 13 is a schematic diagram of 8VSB DTV transmitter apparatus of a third type, which transmitter apparatus is modified in accordance with an aspect of the invention to provide for staggercasting of SCCC words.

FIG. 13 shows 8VSB DTV transmitter apparatus of a third type. This third type of transmitter apparatus is similar to the second type of 8VSB DTV transmitter apparatus shown in FIG. 9 in that stuffing the adaptation fields of selected MPEG-2-compatible packets with outer coding is deferred until after the data randomizer 13. However, in the FIG. 13 transmitter apparatus the data randomizer 13 is connected for applying its response to a first input port of an adaptation field stuffer 62 directly, rather than to the cascade connection of the Reed-Solomon encoder 14 and the convolutional byte interleaver 15. The turbo PPS fragments for staggercasting are supplied to a second input port of the adaptation field stuffer 62 to be stuffed into the adaptation fields of selected MPEG-2-compatible packets. The FIG. 13 transmitter apparatus does not include a turbo post-processor 50, so stuffing the adaptation fields of selected MPEG-2-compatible packets can be performed therewithin. FIG. 13 shows the output port of the convolutional byte interleaver 15 connected directly to the input port of the encoder 17 for 12-phase ⅔ trellis coding, with no intervening turbo post-processor in this third type of 8VSB DTV transmitter apparatus.

Besides the turbo post-processor 50 not being included in the FIG. 13 transmitter apparatus, the FIG. 13 transmitter apparatus also does not include the buffer memory 53 and the placeholder maker 54 for supplying turbo PPS to the turbo post-processor 50. The output port of the encoder 52 is connected for supplying the (208, 188) R-S FEC codewords that the encoder 52 generates to the input port of an encoder 63 of half-code-rate recursive systematic convolutional (RSC) coding. The output port of the encoder 63 is connected for writing the outer RSC coding it generates to buffer memory 64. The buffer memory 64 is read to supply each word of the outer RSC coding to the second input port of the adaptation field stuffer 62 to be stuffed into the adaptation fields of an earlier group of selected MPEG-2-compatible packets, so the outer RSC codeword can be transmitted a first time. Supposing the outer RSC codeword is to be staggercast, after a prescribed interval the buffer memory 64 is read to supply the same outer RSC codeword to the second input port of the adaptation field stuffer 62 to be stuffed into the adaptation fields of a later group of selected MPEG-2-compatible packets, so the outer RSC codeword can be transmitted a second time. The prescribed interval is usually a few seconds long.

Figure 14:
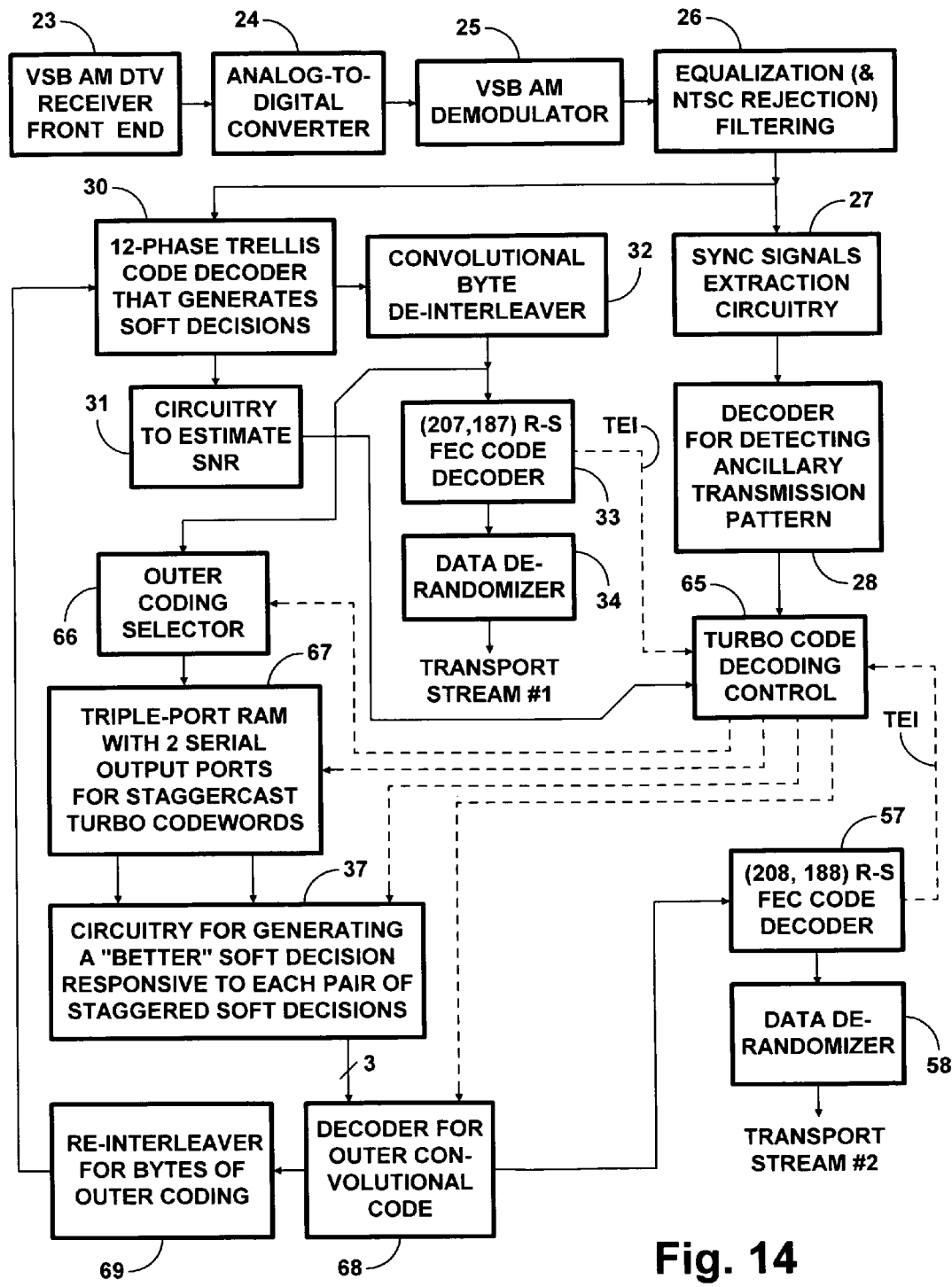
FIG. 14 is a schematic diagram of DTV receiver apparatus for usefully receiving signals as transmitted by the FIG. 13 DTV transmitter apparatus, which receiver apparatus embodies an aspect of the invention.

FIG. 14 shows DTV receiver apparatus for usefully receiving signals as transmitted by the FIG. 13 DTV transmitter apparatus. The FIG. 14 DTV receiver apparatus uses different turbo code decoding control circuitry 65 than the DTV receiver apparatuses of FIGS. 2, 6, 10 and 12. The decoder 28 for detecting the ancillary transmission pattern is connected for supplying information about that pattern to the first input port of turbo code decoding control circuitry 65 that controls turbo decoding in the FIG. 14 DTV receiver apparatus. The turbo code decoding control circuitry 65 responds to this information to generate control signal for an outer coding selector 66, conditioning it to select "soft" decisions concerning outer coding from the response of the de-interleaver 32. This differs from "soft" decisions concerning outer coding being selected directly from the response of the trellis code decoder 30, as is done by the outer coding selector 35 in the DTV receiver apparatuses of FIGS. 2, 6, 10 and 12. This difference takes into account the different way that the FIG. 13 DTV transmitter apparatus stuffs outer RSC coding into the adaptation fields of selected MPEG-2-compatible packets that have been randomized.

The FIG. 14 DTV receiver apparatus employs a triple-port random-access memory 67 instead of either of the triple-port RAMs 36 and 55. In the RAM 67 the shift registers for supplying the current and delayed portions of the staggercast outer convolutional coding to respective serial output ports are configured differently for parallel loading than in the RAM 36 or in the RAM 55. The parallel loading of these shift registers in the RAM 67 takes into account the following fact. In the FIG. 13 transmitter apparatus, all the bits of the outer RSC coding are subjected to convolutional byte interleaving after being stuffed into the adaptation fields of selected MPEG-2-compatible packets of data that have been randomized.

The FIG. 14 DTV receiver apparatus employs a decoder 68 for outer convolutional coding instead of either of the decoders 38 and 56 for outer convolutional coding. The decoder 68 differs from the decoders 38 and 56 to take into account that the bit interleaver for outer convolutional coding may differ in the DTV transmitter apparatuses of different types. Decoding results in soft-decision format that are generated by the decoder 68 for outer convolutional coding are fed back to the decoder 30 for ⅔ trellis coding via a re-interleaver 69 for bytes of the outer convolutional coding. The need for the re-interleaver 69 in each FIG. 14 DTV receiver, in order that extrinsic information can be obtained for the decoder 30 in iterative turbo decoding procedures, is a drawback to the use of DTV transmitter apparatuses of the third type as shown in FIG. 13.

The decoded data supplied from the decoder 68 in hard-decision form has already been de-interleaved by the de-interleaver 32 to compensate for interleaving of the outer convolutional coding by the convolutional byte interleaver 15 in the DTV transmitter apparatus. So, the output port of the decoder 68 for outer convolutional coding that supplies "hard" decisions on data is connected to the input port of the R-S decoder 57. The output port of the R-S decoder 57 is connected for supplying 187-byte packets of randomized data to the data de-randomizer 58. The data de-randomizer 58 undoes the data randomization performed by the data randomizer 51 in the FIG. 13 DTV transmitter apparatus of third type. The data de-randomizer 58 reproduces at its output port the MPEG-2-compatible data packets of the ancillary data transport stream, which FIG. 14 shows as being a second transport stream.

The turbo code decoding control circuitry 59 uses the estimated SNR supplied by the circuitry 31 to determine the maximum number of iterations to be used when decoding each turbo codeword. The R-S decoder 57 is further connected for supplying the turbo code decoding control circuitry 59 indications of byte errors in the 187-byte packets of ancillary data. The turbo code decoding control circuitry 59 uses this information to control the filling of subsequent buffer memory written from the second transport stream. FIG. 14 does not show this subsequent buffer memory.

Figure 15:
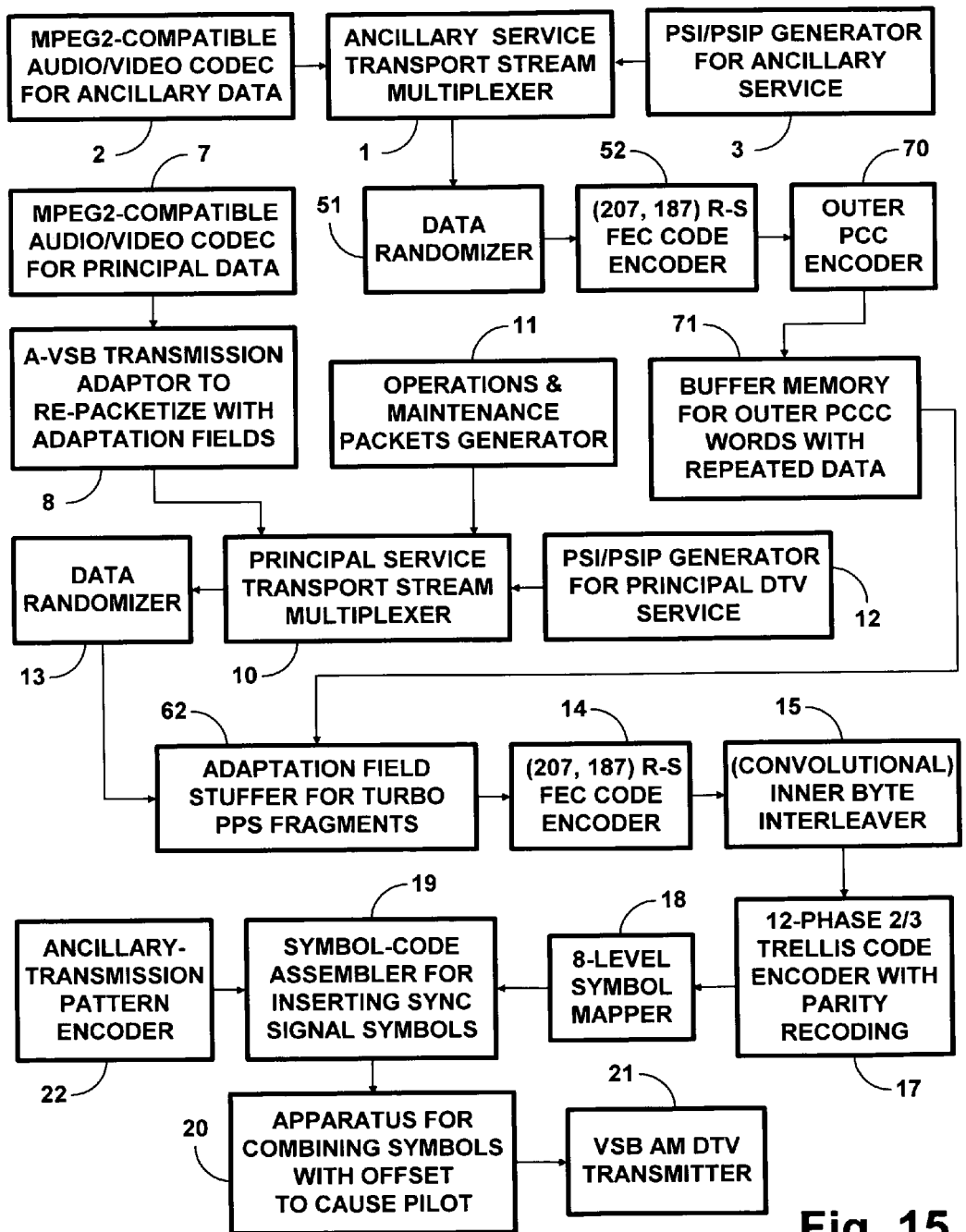
FIG. 15 is a schematic diagram of a modification of the FIG. 13 DTV transmitter apparatus providing for "punctured" staggercasting of SCCC words in accordance with an aspect of the invention.

FIG. 15 shows a modification of the FIG. 13 DTV transmitter apparatus, so as to provide for "punctured" staggercasting of SCCC words. The outer RSC code encoder 63 and the buffer memory 64 are replaced by an outer PCCC encoder 70 and a buffer memory 71. More particularly, the output port of the encoder 52 is connected for supplying (208, 188) R-S FEC codewords to the input port of an encoder 70 for generating parallel concatenated convolutional coding. The encoder 70 is connected for writing to the buffer memory 71 a respective "earlier" RSC codeword and a respective "later" RSC codeword as components of each outer PCCC word. The buffer memory 71 is read to supply the "earlier" RSC codeword components of a set of outer PCCC words to the second input port of the adaptation field stuffer 62. These "earlier" RSC codeword are there stuffed into the adaptation fields of an earlier group of selected MPEG-2-compatible packets. This arranges these "earlier" RSC codeword components for transmission relatively early in time. After a prescribed interval, the buffer memory 71 is read to supply the "later" RSC codeword components of that same set of outer PCCC words to the second input port of the adaptation field stuffer 62. These "later" RSC codeword are there stuffed into the adaptation fields of a later group of selected MPEG-2-compatible packets. This arranges these "later" RSC codeword components for transmission relatively late in time. The prescribed "stagger" interval between the relatively early transmission and relatively late transmission is usually a few seconds long.

Figure 16:
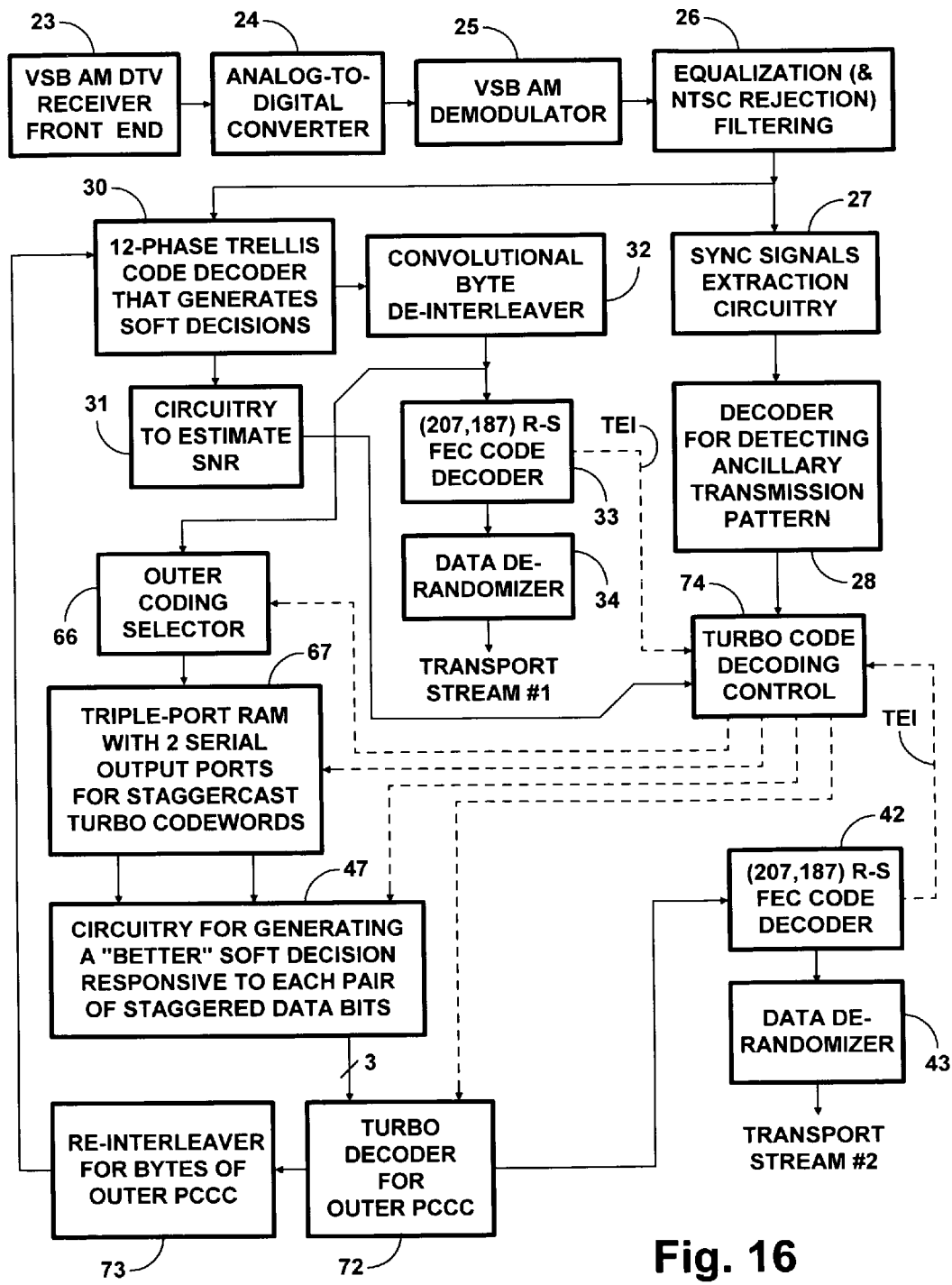
FIG. 16 is a schematic diagram of DTV receiver apparatus for usefully receiving signals as transmitted by the FIG. 15 DTV transmitter apparatus, which receiver apparatus embodies an aspect of the invention.

FIG. 16 shows DTV receiver apparatus for usefully receiving signals as transmitted by the FIG. 15 DTV transmitter apparatus. The FIG. 16 DTV receiver apparatus differs from that of FIG. 14 in the following respects. The circuitry 37 for generating a "better" soft decision responsive to each pair of "soft" decisions supplied thereto is replaced by circuitry 47 for generating "better" soft decisions just for data bits, which are repeated, and not for parity bits, which are not repeated. The decoder 68 for outer convolutional coding is replaced by a decoder 72 for outer parallel concatenated convolutional coding (outer PCCC). The byte re-interleaver 69 for "soft" decisions concerning outer RSC coding is replaced by a byte re-interleaver 73 for "soft" decisions concerning outer PCCC. The turbo code decoding control circuitry 65 is replaced by turbo code decoding control circuitry 74 that generates suitable control signals for the circuitry 47 and the decoder 72 for outer PCCC. The turbo code decoding control circuitry 74 also generates suitable control signals for other elements in the FIG. 16 receiver apparatus similar to those in the FIG. 14 receiver apparatus. The turbo code decoding control circuitry 74 uses the estimated SNR supplied by the circuitry 31 to determine the maximum number of iterations to be used when decoding each turbo codeword.

In FIG. 16 the first and second serial output ports of the memory 67 respectively connect to first and second input ports of the circuitry 47 for generating a "better" soft decision responsive to each pair of "soft" decisions concerning data bits that are concurrently read thereto from the memory 67. The circuitry 47 compares each pair of concurrent "soft" decisions concerning data bits that are read thereto. The "better" one of the "soft" decisions is selected for application to a first output port of the circuitry 47. The "earlier" set of parity bytes supplied from the RAM 67 to the circuitry 47 is forwarded to a second output port of the circuitry 47. The "later" set of parity bytes supplied from the RAM 67 to the circuitry 47 is forwarded to a third output port of the circuitry 47. The turbo decoder 72 for outer PCCC is connected for receiving each set of data bytes and the two corresponding sets of parity bytes from the first, second and third ports of the circuitry 47. FIG. 16 shows the turbo decoder 72 for outer PCCC connected for supplying its decoding results to the decoder 57 for (208, 188) R-S FEC codewords, which codewords are reproduced in the "hard decision" decoding results from the turbo decoder 72.

FIG. 16 also shows a connection for feeding decoding results from the turbo decoder 72 for outer PCCC back to the trellis decoder 30 via byte re-interleaver 73 for "soft" decisions concerning outer PCCC. This allows the extraction of extrinsic information that the trellis decoder 30 can use for SCCC turbo decoding. The SCCC turbo decoding may benefit trellis decoding for ordinary 8VSB as well as for SCCC. The need for the re-interleaver 73 in each FIG. 16 DTV receiver, in order that extrinsic information can be obtained for the decoder 30 in iterative turbo decoding procedures, is a drawback to the use of DTV transmitter apparatuses of the third type as shown in FIG. 15.

Because of space limitations, FIG. 2 omits certain conventional details of the turbo decoding loop for SCCC that do not particularly pertain to the invention. The decoder 38 for the outer convolutional code is preceded by a bit or 2-bit-symbol de-interleaver for the results of inner convolutional decoding by the trellis code decoder 30, which de-interleaver is not explicitly shown in FIG. 2. The decoder 38 for the outer convolutional code is followed by a bit or 2-bit-symbol re-interleaver for the results of outer convolutional decoding, which re-interleaver is not explicitly shown in FIG. 2. There is circuitry for generating extrinsic information for feeding back to the trellis code decoder 30. However, because of the long delay of the earlier received portion of the staggercast, only the later received portion of the staggercast stored in the memory associated with the trellis code decoder 30 is updated responsive to the extrinsic information. Similar comments apply to the turbo decoding loops for SCCC shown in FIGS. 10 and 14.

Figure 17:
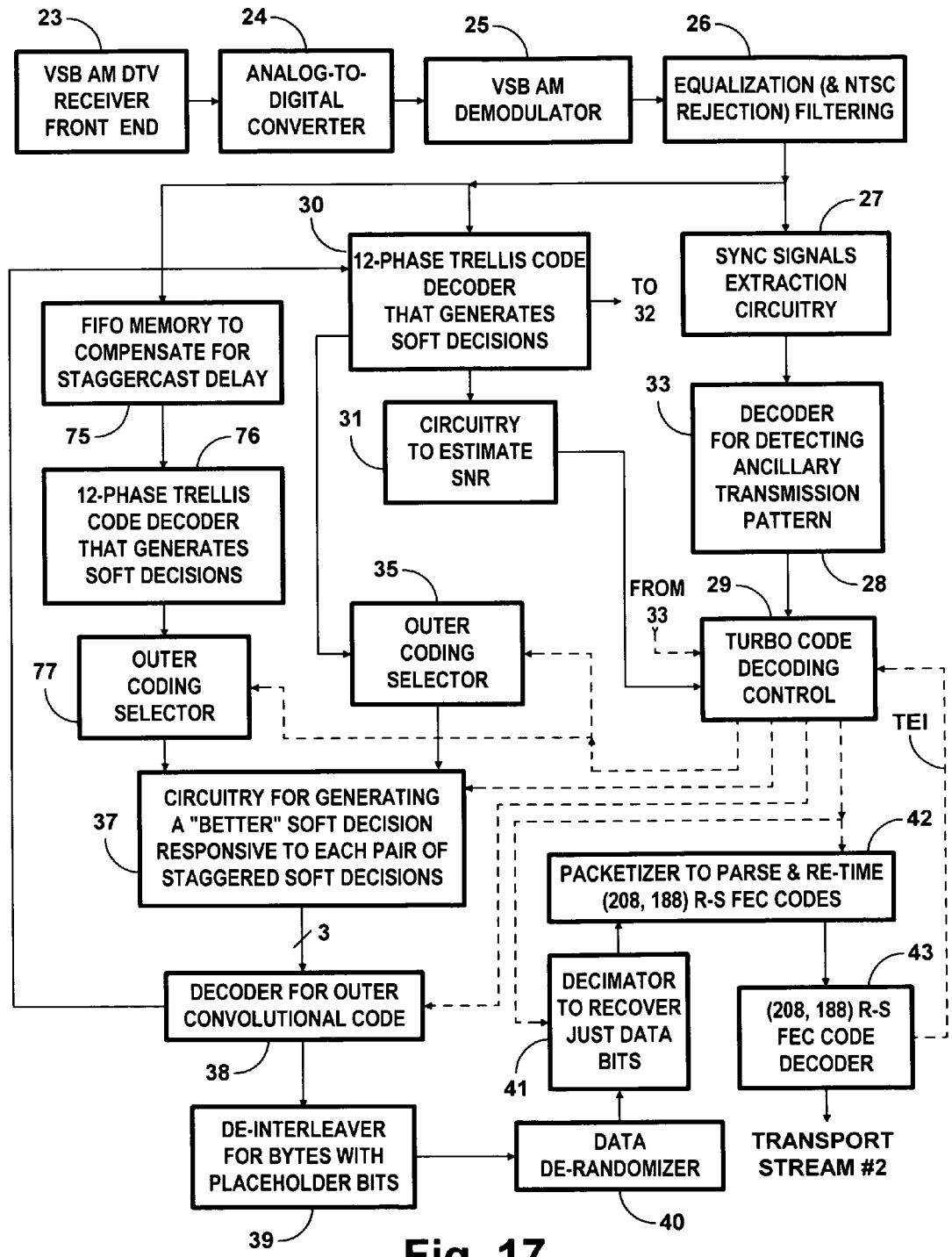
FIG. 17 is a schematic diagram of a modification of the FIG. 2 DTV receiver apparatus.

FIG. 17 shows a modification of the FIG. 2 DTV receiver apparatus, which modification facilitates extrinsic information being used for turbo decoding the earlier received portion of the staggercast as well as the later received portion of the staggercast. The FIG. 17 DTV receiver apparatus does not include the RAM 36 nor connections from the serial output ports thereof to supply successive pairs of "soft" decisions to the circuitry 37 for generating a "better" soft decision responsive to each such pairs of "soft" decisions. FIG. 17 shows a first-in, first-out memory 75 connected for receiving the baseband DTV signal response of the digital filtering 26 for equalization of channel response and for rejection of co-channel interfering NTSC signal. The FIFO memory 75 is connected for supplying delayed response from the digital filtering 26 to the input port of a 12-phase trellis code decoder 76 of the same type as the 12-phase trellis code decoder 30. The FIFO memory 75 delays the digital filtering 26 sufficiently that the earlier received portion of the staggercast is supplied to the trellis code decoder 76 contemporaneously with the later received portion of the staggercast being supplied to the trellis code decoder 30. An outer coding selector 77 and the outer coding selector 35 receive a control signal in common from the turbo coding control circuitry 29. This control signal conditions the outer coding selector 77 to reproduce the "soft" decisions made by the trellis code decoder 76 in regard to outer coding of the earlier received portion of the staggercast. This control signal conditions the outer coding selector 35 to reproduce the "soft" decisions made by the trellis code decoder 70 in regard to outer coding of the later received portion of the staggercast. The circuitry 37 for generating a "better" soft decision responsive to each pair of "soft" decisions is connected for receiving successive pairs of "soft" decisions as reproduced in the responses of the outer coding selectors 77 and 35.

Figure 18:
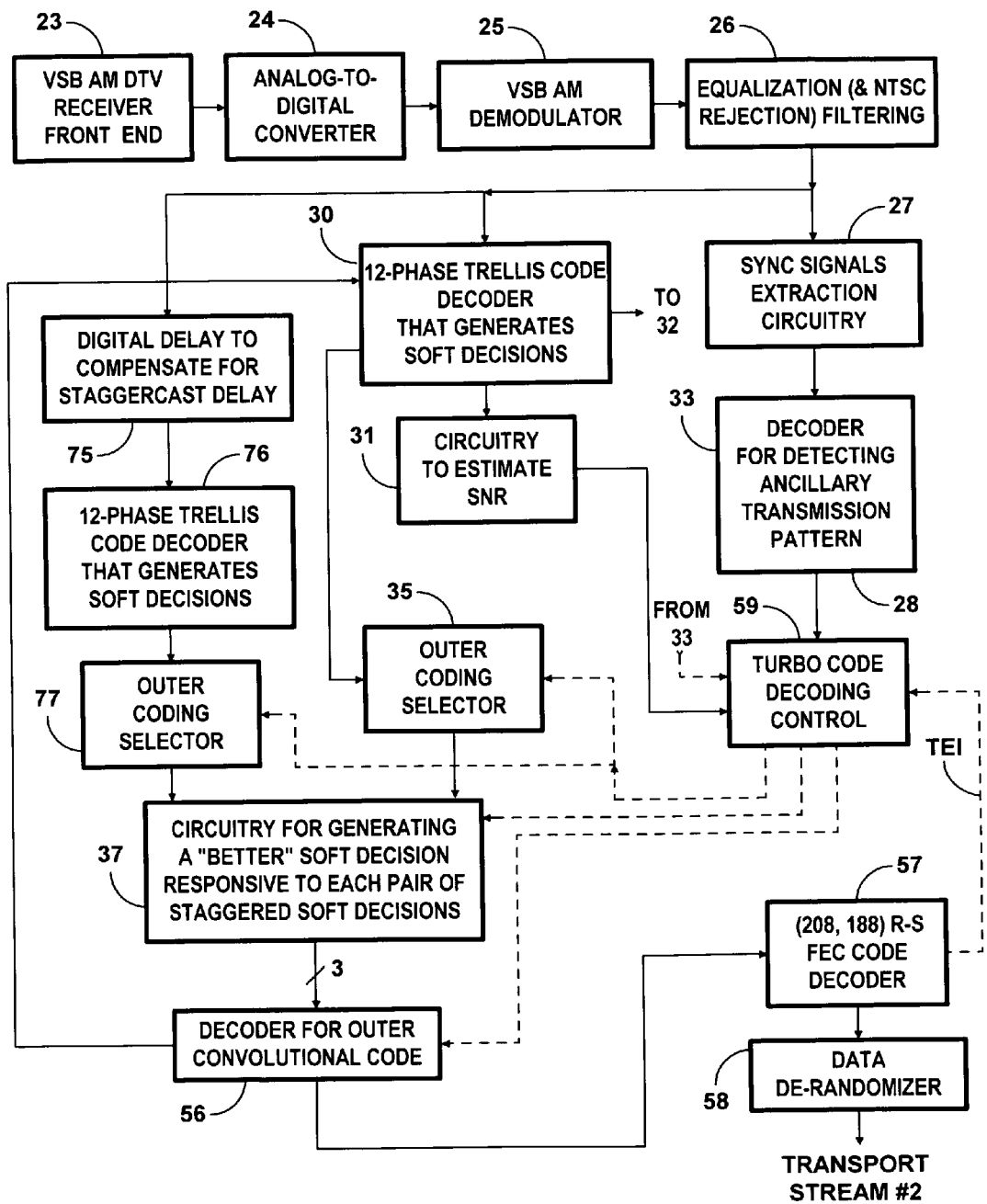
FIG. 18 is a schematic diagram of a modification of the FIG. 10 DTV receiver apparatus.

FIG. 18 shows a modification of the FIG. 10 DTV receiver apparatus, which modification facilitates extrinsic information being used for turbo decoding the earlier received portion of the staggercast as well as the later received portion of the staggercast. The FIG. 18 DTV receiver apparatus does not include the RAM 55 nor connections from the serial output ports thereof to supply successive pairs of "soft" decisions to the circuitry 37 for generating a "better" soft decision responsive to each such pairs of "soft" decisions. The successive pairs of "soft" decisions are supplied to the circuitry 37 similarly to the way described in the foregoing paragraph with respect to FIG. 17.

Because of space limitations, FIG. 6 omits certain conventional details of the turbo decoding loop that do not particularly pertain to the invention. The turbo decoder 48 for the outer PCCC is preceded by bit de-interleavers or 2-bit-symbol de-interleavers for the results of inner convolutional decoding by the trellis code decoder 30, which de-interleavers are not explicitly shown in FIG. 6. The turbo decoder 48 for the outer PCCC is followed by bit re-interleavers or 2-bit-symbol re-interleavers for the results of PCCC decoding, which re-interleavers are not explicitly shown in FIG. 6. There is circuitry for generating extrinsic information for feeding back to the trellis code decoder 30. However, because of the long delay of the earlier received portion of the staggercast, only the later received portion of the staggercast stored in the memory associated with the trellis code decoder 30 is updated responsive to the extrinsic information. Similar comments apply to the turbo decoding loops shown in FIGS. 12 and 16.

Figure 19:
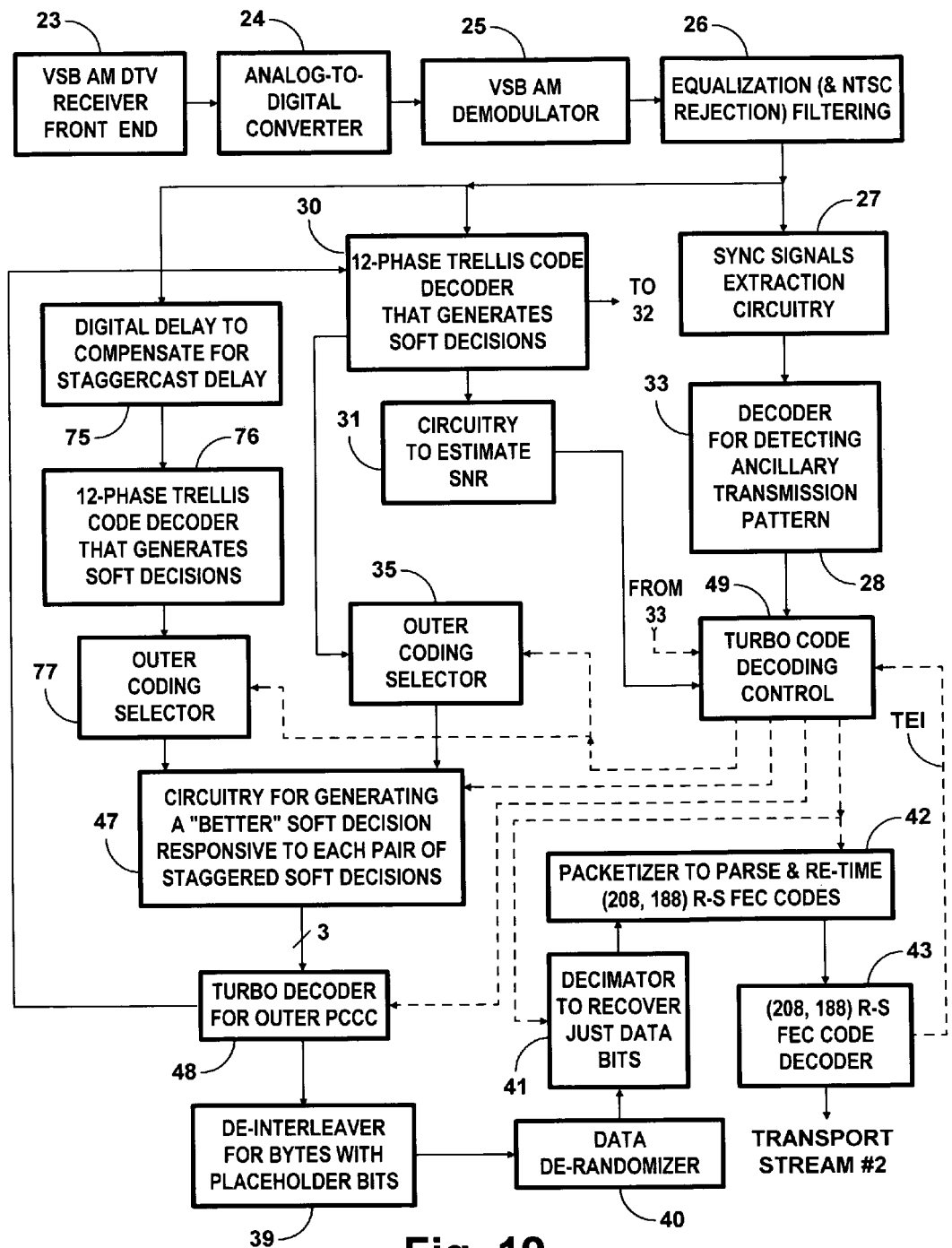
FIG. 19 is a schematic diagram of a modification of the FIG. 6 DTV receiver apparatus.

FIG. 19 shows a modification of the FIG. 6 DTV receiver apparatus, which modification facilitates extrinsic information being used for turbo decoding the earlier received portion of the staggercast as well as the later received portion of the staggercast. The FIG. 19 DTV receiver apparatus does not include the RAM 36 nor connections from the serial output ports thereof to supply successive pairs of "soft" decisions to the circuitry 47 for generating a "better" soft decision responsive to each such pairs of "soft" decisions. The first-in, first-out memory 75 is connected for receiving the baseband DTV signal response of the digital filtering 26 for equalization of channel response and for rejection of co-channel interfering NTSC signal. The FIFO memory 75 is connected for supplying delayed response from the digital filtering 26 to the input port of the 12-phase trellis code decoder 76 of the same type as the 12-phase trellis code decoder 30. The FIFO memory 75 delays the digital filtering 26 sufficiently that the earlier received portion of the staggercast is supplied to the trellis code decoder 76 contemporaneously with the later received portion of the staggercast being supplied to the trellis code decoder 30. The outer coding selector 77 and the outer coding selector 35 receive a control signal in common from the turbo coding control circuitry 49. This control signal conditions the outer coding selector 77 to reproduce the "soft" decisions made by the trellis code decoder 76 in regard to outer coding of the earlier received portion of the staggercast. This control signal conditions the outer coding selector 35 to reproduce the "soft" decisions made by the trellis code decoder 70 in regard to outer coding of the later received portion of the staggercast. The circuitry 47 for generating a "better" soft decision responsive to each pair of "soft" decisions is connected for receiving successive pairs of "soft" decisions as reproduced in the responses of the outer coding selectors 77 and 35.

Figure 20:
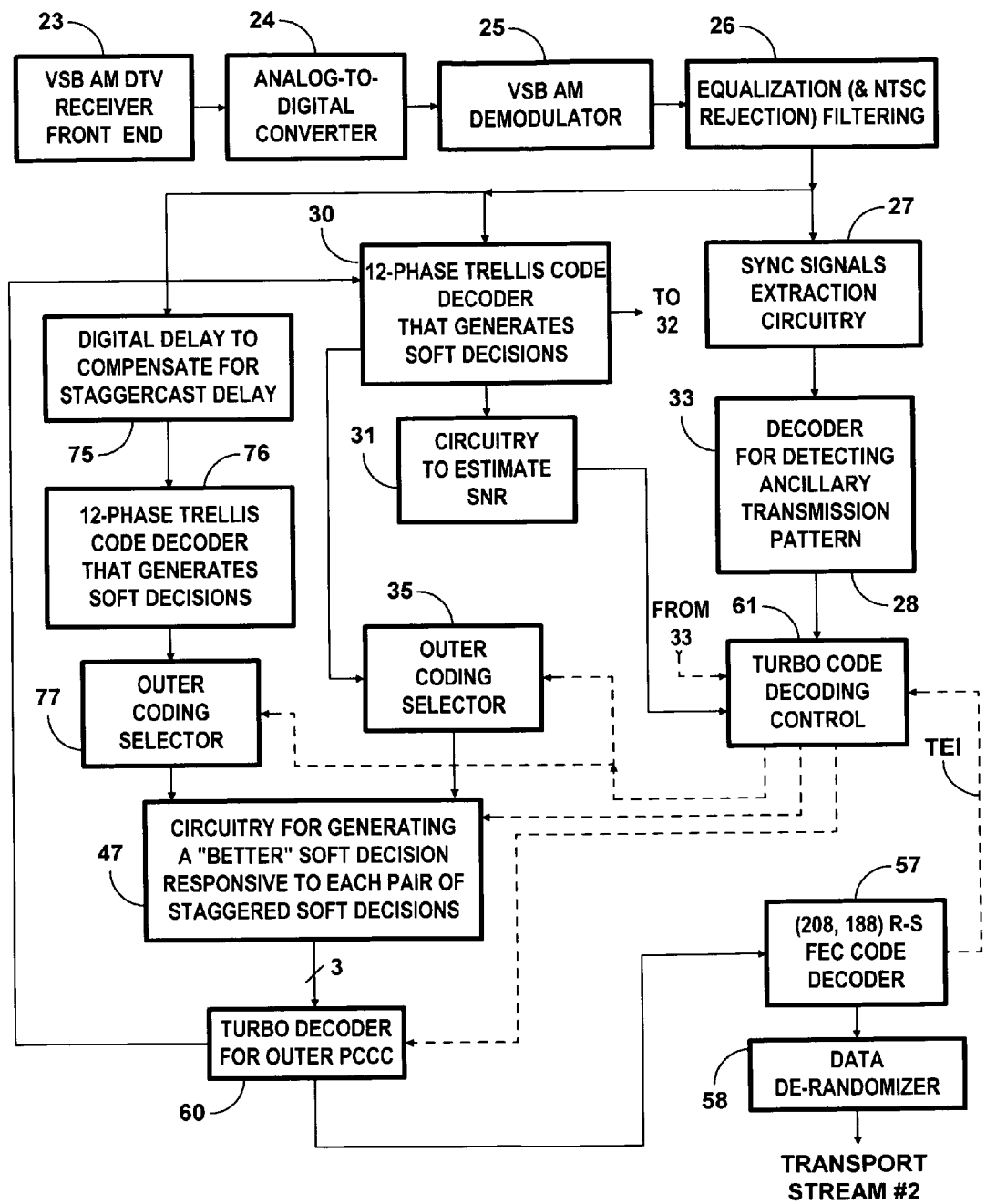
FIG. 20 is a schematic diagram of a modification of the FIG. 12 DTV receiver apparatus.
Figure 21:
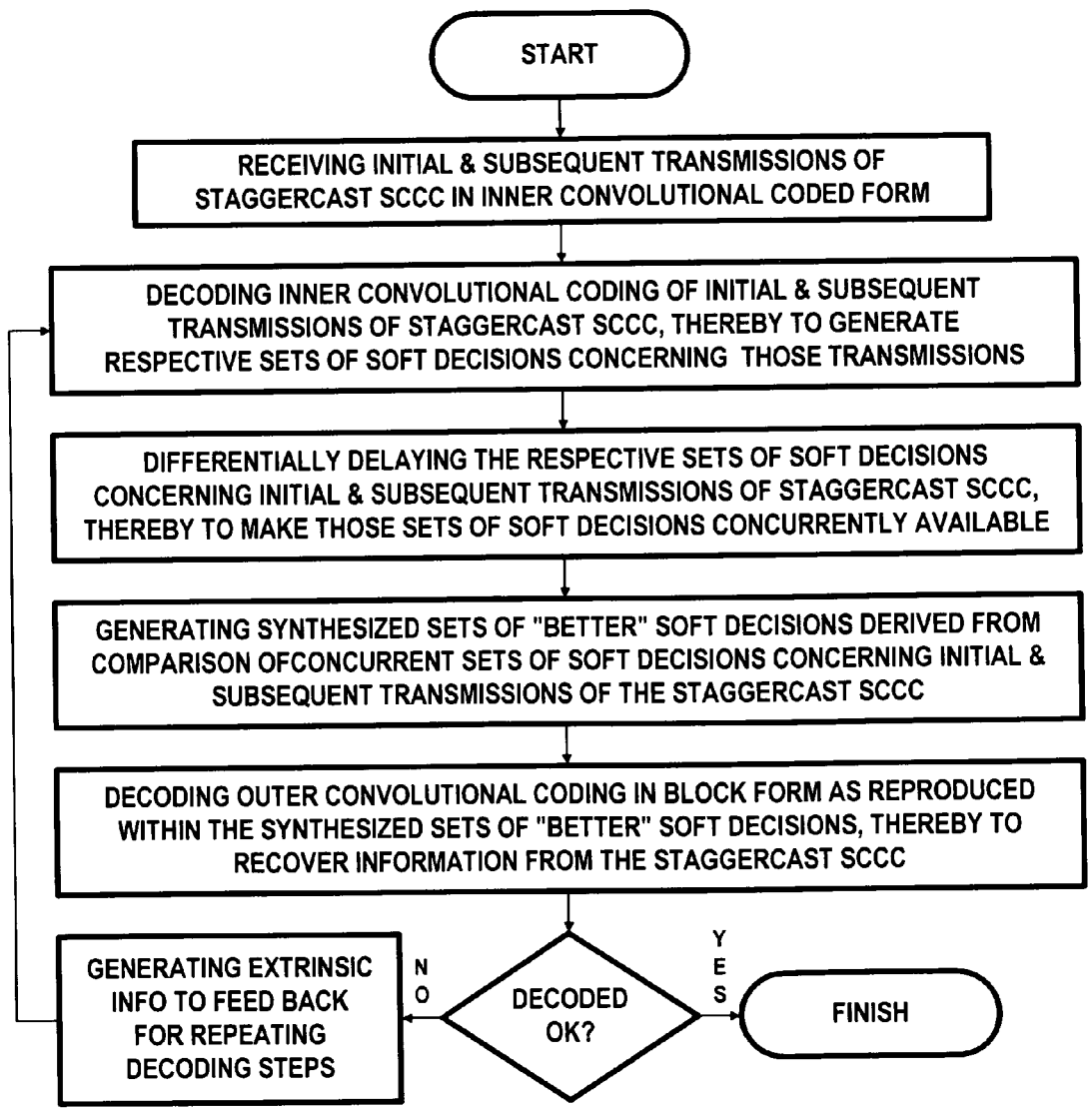
FIG. 21 is a flow chart illustrating a general method of receiving staggercast DTV signals in accordance with an aspect of the invention.
Figure 22:
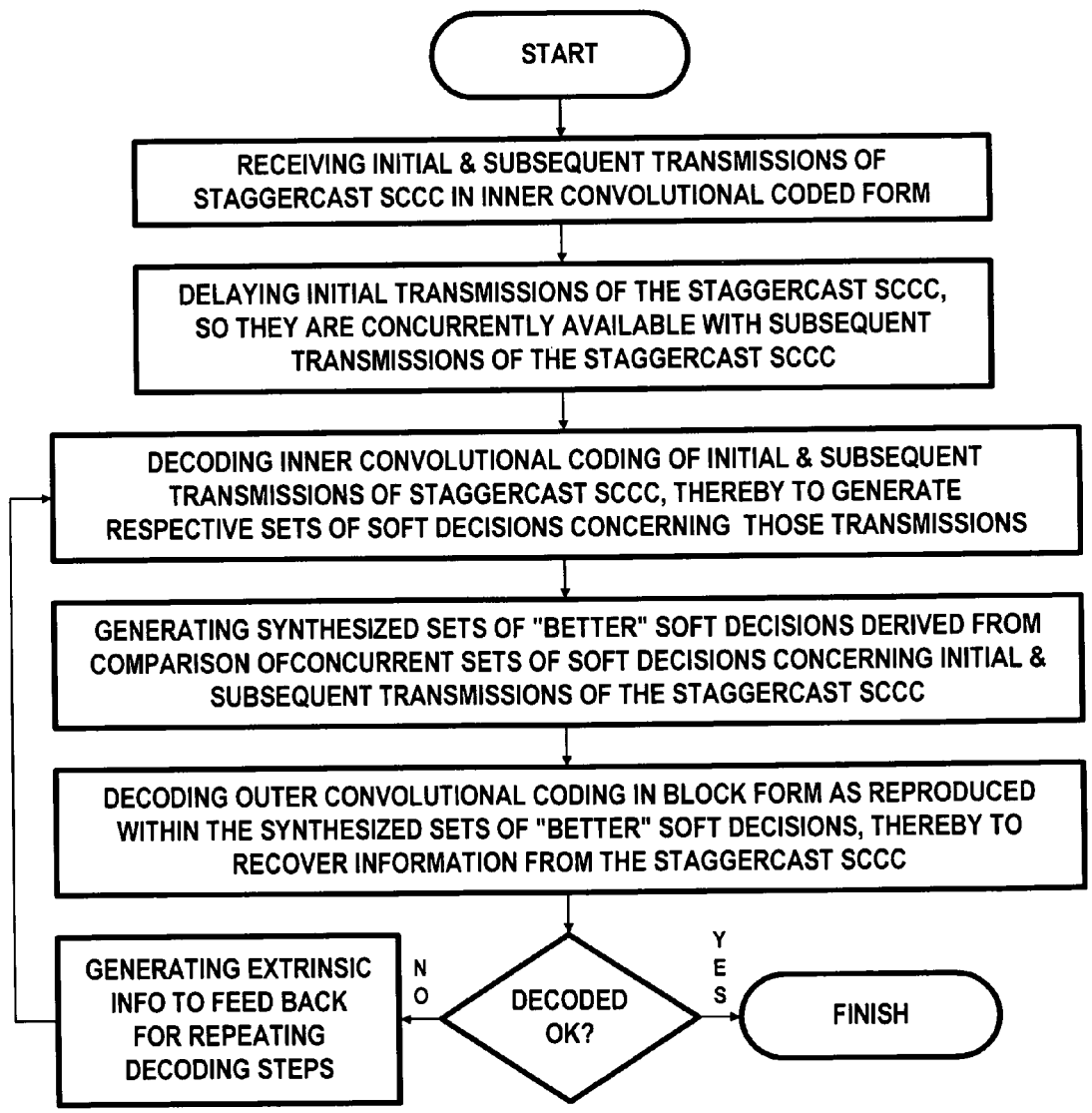
FIG. 22 is a flow chart illustrating a modification of that general method of receiving staggercast DTV signals in accordance with another aspect of the invention.
Figure 23:
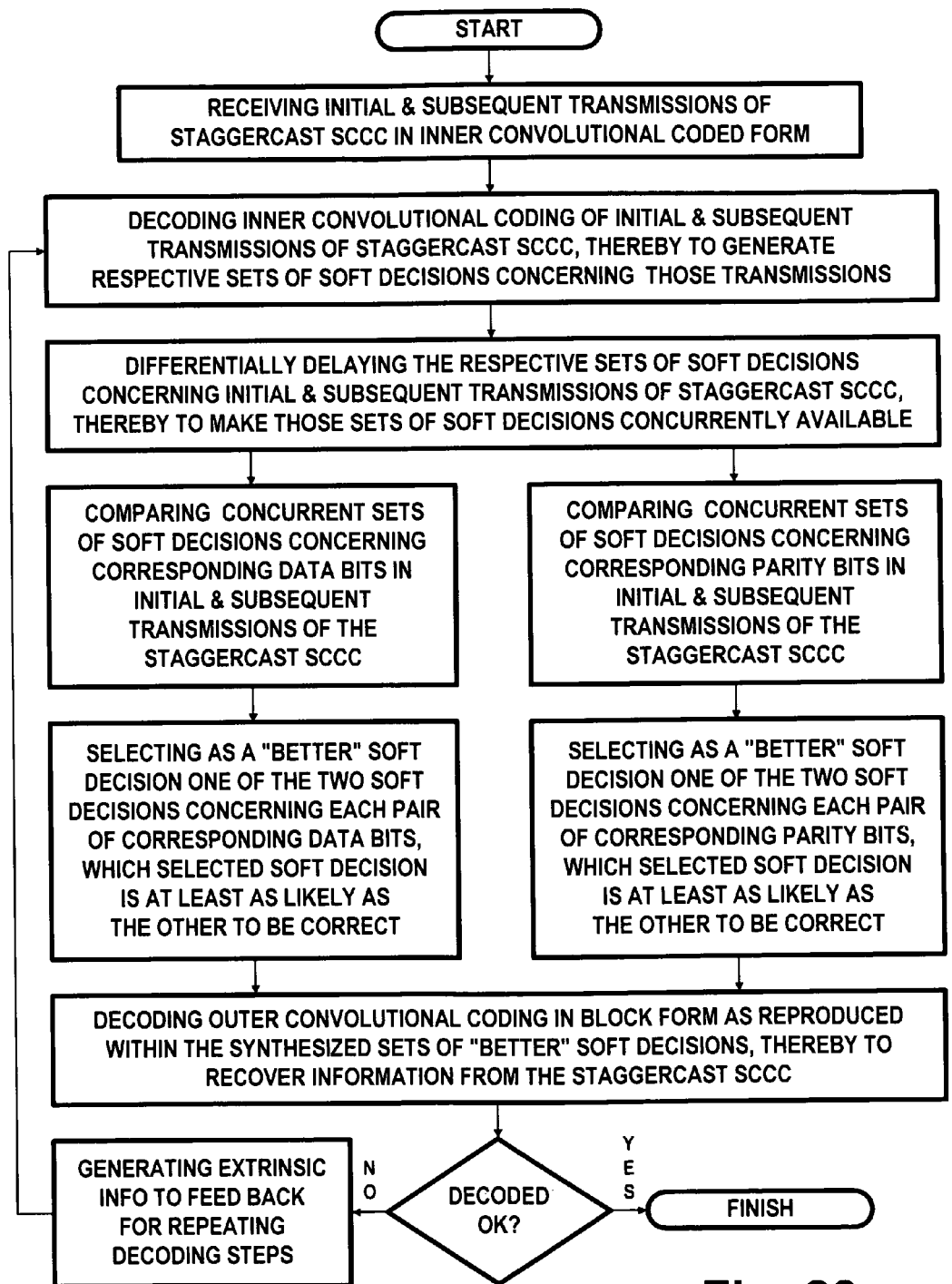
FIG. 23 is a flow chart illustrating a specific method of receiving staggercast DTV signals used in the DTV receivers of FIGS. 2, 10 and 14 in accordance with an aspect of the invention.
Figure 24:
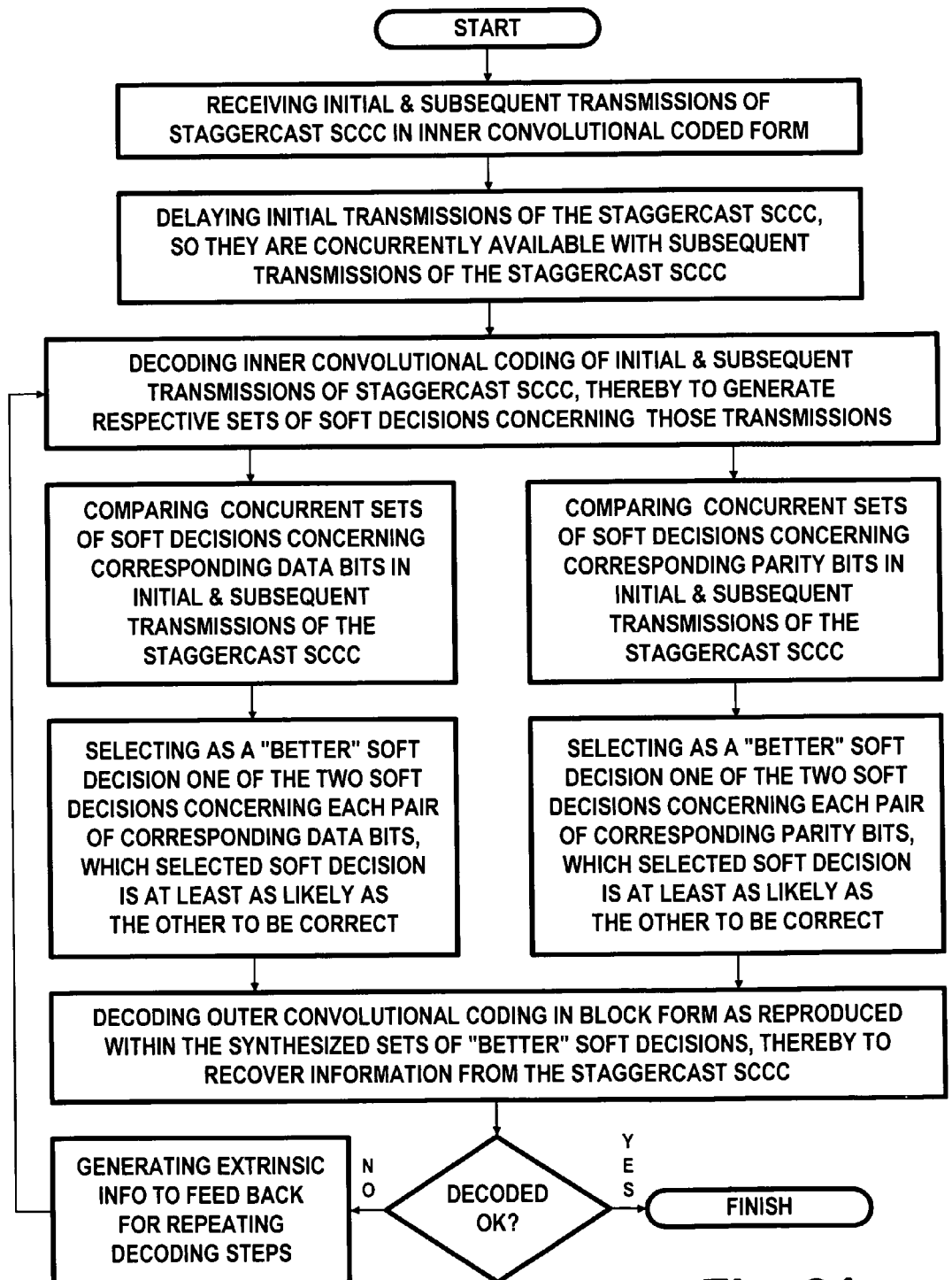
FIG. 24 is a flow chart illustrating a modification of that specific method of receiving staggercast DTV signals used in the DTV receivers of FIGS. 17 and 18 in accordance with another aspect of the invention.
Figure 25:
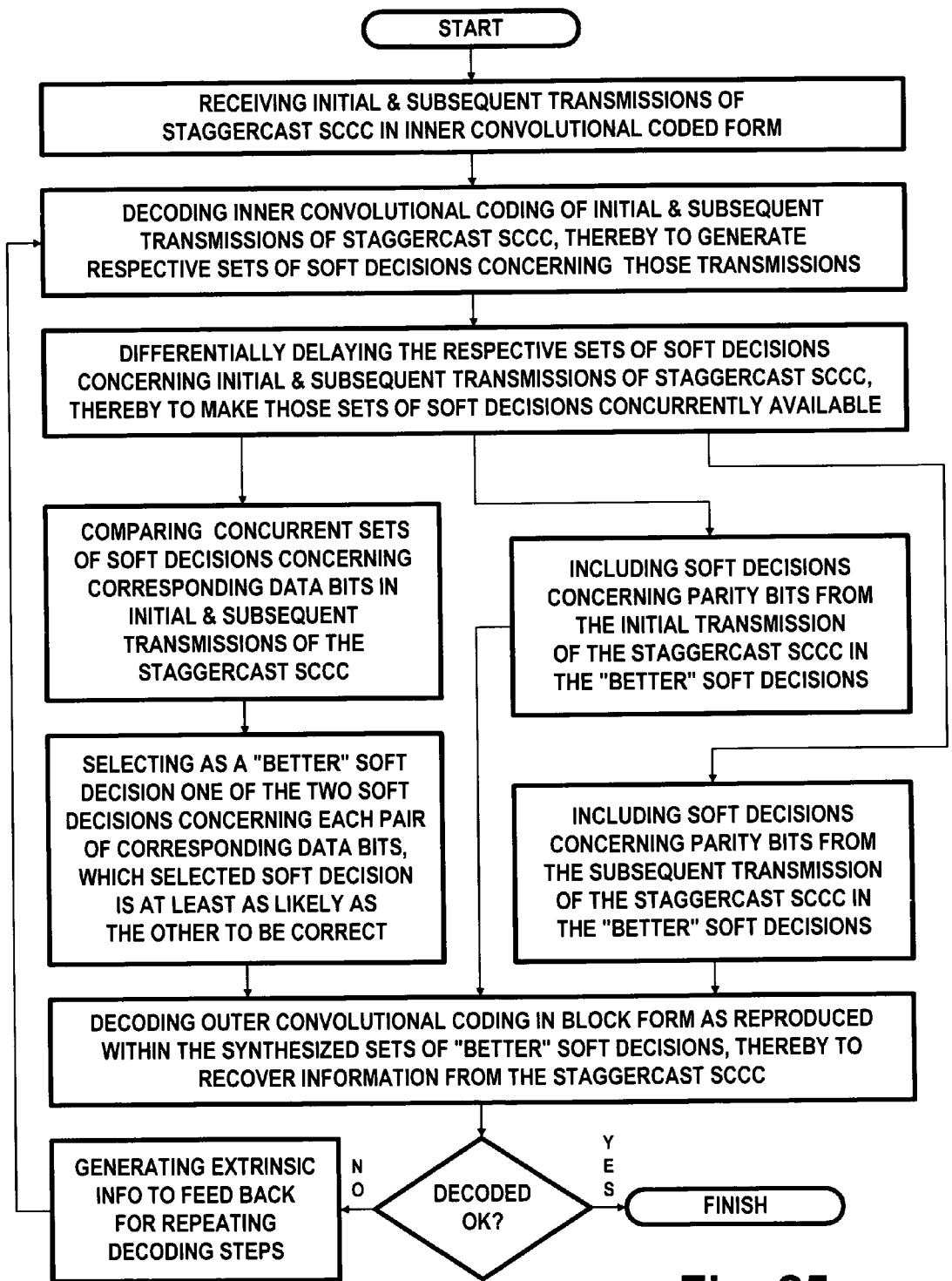
FIG. 25 is a flow chart illustrating a specific method of receiving staggercast DTV signals used in the DTV receivers of FIGS. 6, 12 and 16 in accordance with an aspect of the invention.
Figure 26:
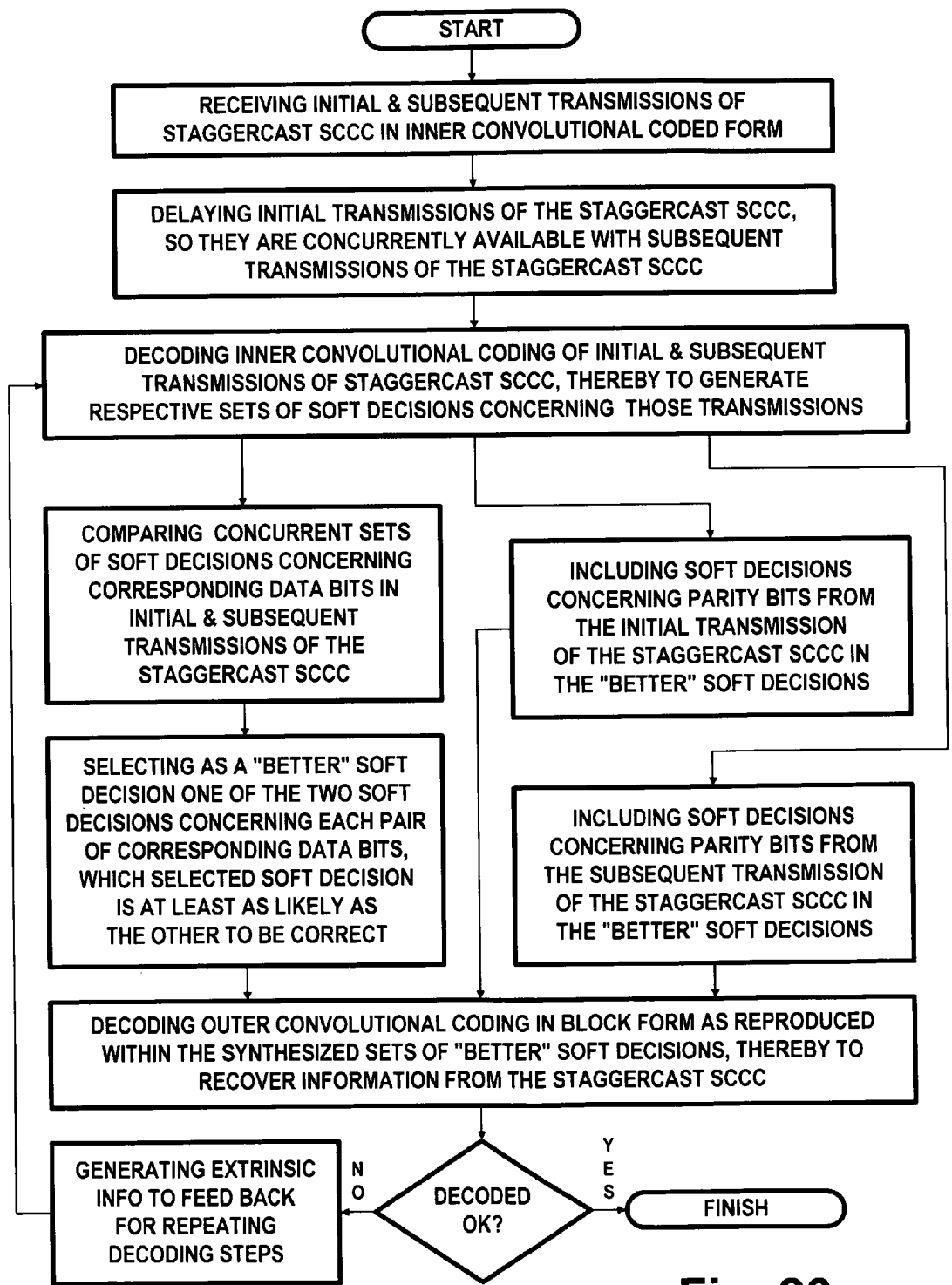
FIG. 26 is a flow chart illustrating a modification of that specific method of receiving staggercast DTV signals used in the DTV receivers of FIGS. 19 and 20 in accordance with another aspect of the invention.

FIG. 20 shows a modification of the FIG. 12 DTV receiver apparatus, which modification facilitates extrinsic information being used for turbo decoding the earlier received portion of the staggercast as well as the later received portion of the staggercast. The FIG. 20 DTV receiver apparatus does not include the RAM 55 nor connections from the serial output ports thereof to supply successive pairs of "soft" decisions to the circuitry 47 for generating a "better" soft decision responsive to each such pairs of "soft" decisions. The successive pairs of "soft" decisions are supplied to the circuitry 47 similarly to the way described supra with respect to FIG. 19.

The foregoing specification specifically describes the outer convolutional coding being stuffed into the adaptation fields of selected MPEG-2-compatible packets of data, either before or after the randomization of data in those packets. However, alternatively, the outer convolutional coding can be stuffed into the payload fields of selected MPEG-2-compatible packets of data. The precepts of the invention are still applicable if this is done. The precepts of the invention are still applicable if these two types of stuffing outer convolutional coding into selected MPEG-2-compatible packets of data are both used on an intermixed basis.

Staggercasting in accordance with the precepts of the invention can be done to improve the capability of DTV receivers to withstand protracted drop-outs in received signal strength, even though outer byte interleaving and Reed-Solomon coding are used. In the prior art the capability of outer byte de-interleaving and Reed-Solomon decoding to overcome drop-outs in received signal strength of relatively long duration was compromised by drop-outs in received signal strength of relatively short duration using up RS FEC capability. In the prior art staggercasting was done to allow the replacement of transport stream (TS) data packets lost during a protracted drop-out in received signal strength with previously transmitted corresponding TS data packets. Staggercasting done in accordance with the precepts of the invention permits even short-duration losses of signal less than a TS data packet long to be replaced with previously transmitted data. The correction for such short-duration losses of signal strength avoids those losses diminishing the capability of the outer byte de-interleaving and Reed-Solomon decoding to overcome longer-duration losses of signal strength. That is, there is a novel synergy between staggercasting per the invention and the use of outer byte de-interleaving and Reed-Solomon decoding to overcome drop-outs in received signal strength. This is in addition to the capability of staggercasting to overcome drop-outs in received signal strength that are longer than those that can be overcome by the outer byte de-interleaving and Reed-Solomon decoding.

Staggercasting in accordance with the precepts of the invention can be done to improve the capability of DTV receivers to withstand protracted drop-outs in received signal strength, even though transversal Reed-Solomon (TRS) coding is used. Staggercasting done in accordance with the precepts of the invention permits even short-duration losses of signal less than a TS data packet long to be replaced with previously transmitted data. The correction for such short-duration losses of signal strength avoids those losses diminishing the capability of TRS decoding to overcome longer-duration losses of signal strength. That is, there is a novel synergy between staggercasting per the invention and the use of TRS decoding to overcome drop-outs in received signal strength. This is in addition to the capability of staggercasting to overcome drop-outs in received signal strength that are longer than those that can be overcome by the TRS decoding. In particular, the MPH system proposed by LG Electronics can be improved in accordance with the precepts of the invention. The form of SCCC used in that system resembles that in the systems described supra with reference to FIGS. 13, 14, 15 and 16 of the accompanying drawing.

A person skilled in the art of digital communications receiver design will be enabled by acquaintance with this disclosure to design DTV receivers somewhat different from the particular ones described, and this should be borne in mind when considering the scope of the invention as defined by the claims which follow this specification. The memory 36, 55 or 67 for staggercasting storage and the memory in the trellis code decoder 30 can be parts of a single memory in some DTV receivers embodying the invention in certain of its aspects. In these receivers the turbo coding selector 35 or 66 is realized in effect through proper read addressing of this single memory. In some of these DTV receivers the "better" soft decisions generated by the circuitry 37 or 47 may write over "soft" decisions concerning received staggercast signal stored in the memory. These "better" soft decisions will subsequently be used in iterated convolutional decoding, the memory being read from directly to the outer decoder 38, 48, 56 or 60 during iterations of decoding the same turbo codewords.

It will be apparent to those skilled in the art and acquainted with this disclosure that various modifications and variations can be made in the invention described without departing from the spirit or scope of the invention. Thus, it is intended that this invention comprises any such modifications and variations that come within the scope of the appended claims and their equivalents.

What is claimed is:

1. A method for receiving digital television signals that utilize staggercast serially concatenated convolutional coding (SCCC), said SCCC generated by inner convolutional coding of outer convolutional coding of successive blocks of data, said method comprising steps of:

receiving time-interleaved initial and subsequent SCCC transmissions of said staggercast SCCC, said subsequent SCCC transmission transmitting each of said successive blocks of data corresponding to respective ones of said successive blocks of data transmitted in said initial SCCC transmissions a prescribed time interval earlier;

decoding the inner convolutional coding of said time-interleaved initial and subsequent transmissions of said staggercast SCCC, so as to generate respective sets of soft decisions concerning said outer convolutional coding of said initial transmission of said staggercast SCCC and concerning said outer convolutional coding of said subsequent transmission of said staggercast SCCC;

differentially delaying said respective sets of soft decisions concerning the outer convolutional coding of said initial and subsequent transmissions of said staggercast SCCC so as to be concurrently available;

generating synthesized sets of "better" soft decisions derived from comparison of said respective sets of soft decisions concerning the outer convolutional coding of said initial and subsequent transmissions of said staggercast SCCC, as differentially delayed so as to be concurrently available; and decoding said outer convolutional coding as reproduced within said synthesized sets of "better" soft decisions, thereby to recover information content from said digital television signals.

2. The method of claim 1 for receiving digital television signals that utilize staggercast SCCC wherein the outer convolutional coding employed in said subsequent transmission of said staggercast SCCC is substantially the same as the outer convolutional coding employed in said initial transmission of said staggercast SCCC in regard to data bits, parity bits and interleaving between said outer convolutional coding and said inner convolutional coding.

3. The method of claim 2, wherein said step of generating synthesized sets of "better" soft decisions comprises substeps of:
- comparing respective sets of soft decisions concerning corresponding data bits of the outer convolutional coding of said initial and subsequent transmissions of said staggercast SCCC as differentially delayed so as to be concurrently available;
- selecting a soft decision of each pair of soft decisions concerning corresponding data bits that is at least as likely as the other to be correct as the "better" soft decision, for inclusion in a current one of said synthesized sets of "better" soft decisions;
- comparing respective sets of soft decisions concerning corresponding parity bits of the outer convolutional coding of said initial and subsequent transmissions of said staggercast SCCC as differentially delayed so as to be concurrently available; and
- selecting a soft decision of each pair of soft decisions concerning corresponding parity bits that is at least as likely as the other to be correct as the "better" soft decision, for inclusion in said current one of said synthesized sets of "better" soft decisions.

4. The method of claim 3, wherein said step of decoding said outer convolutional coding as reproduced within said synthesized sets of "better" soft decisions is performed using a turbo decoding procedure comprising the substeps of:
- decoding said outer convolutional coding as reproduced within each successive one of said synthesized sets of "better" soft decisions, thereby to generate a set of hard decisions and an updated set of soft decisions;
- determining whether said hard decisions are sufficiently correct;
- if said hard decisions are sufficiently correct, discontinuing said turbo decoding procedure in regard to the current one of said synthesized sets of "better" soft decisions;
- if said hard decisions are not sufficiently correct, developing extrinsic information from said updated set of soft decisions; and
- repeating the step of decoding the inner convolutional coding of said initial and subsequent transmissions of said staggercast SCCC and the succeeding steps of the method per claims 1, 2 and 3.

5. The method of claim 1 for receiving digital television signals that utilize staggercast SCCC wherein the outer convolutional coding employed in said subsequent transmission of said staggercast SCCC differs from the outer convolutional coding employed in said initial transmission of said staggercast SCCC, but is similar in regard to data bits and interleaving of those data bits between said outer convolutional coding and said inner convolutional coding.

6. The method of claim 5, wherein said step of generating synthesized sets of "better" soft decisions comprises substeps of:
- comparing respective sets of soft decisions concerning corresponding data bits of the outer convolutional coding of said initial and subsequent transmissions of said staggercast SCCC as differentially delayed so as to be concurrently available;
- selecting a soft decision of each pair of soft decisions concerning corresponding data bits that is at least as likely as the other to be correct as the "better" soft decision, for inclusion in a current one of said synthesized sets of "better" soft decisions;
- including soft decisions concerning parity bits of the outer convolutional coding of said initial transmission of said staggercast SCCC in said current one of said synthesized sets of "better" soft decisions; and
- including soft decisions concerning parity bits of the outer convolutional coding of said subsequent transmission of said staggercast SCCC in said current one of said synthesized sets of "better" soft decisions.

7. The method of claim 6, for receiving digital television signals in which said outer convolutional coding employed in said initial and subsequent transmissions of said staggercast SCCC is provided by parallel concatenated convolutional coding (PCCC), wherein said step of decoding said outer convolutional coding as reproduced within said synthesized sets of "better" soft decisions is performed using a PCCC decoding procedure that comprises substeps of:
- decoding said outer convolutional coding as defined by "better" soft decisions concerning data bits and parity bits of the outer convolutional coding of said subsequent transmission of said staggercast SCCC to generate updated "better" soft decisions and hard decisions concerning data bits of said staggercast SCCC;
- determining whether said hard decisions are sufficiently correct;
- if said hard decisions are sufficiently correct, discontinuing said PCCC decoding procedure in regard to the current one of said synthesized sets of "better" soft decisions;
- if said hard decisions are not sufficiently correct, decoding said outer convolutional coding as defined by said updated "better" soft decisions concerning data bits of said staggercast SCCC and by soft decisions concerning parity bits of the outer convolutional coding of said initial transmission of said staggercast SCCC to generate further updated "better" soft decisions and updated hard decisions concerning data bits of said staggercast SCCC;
- determining whether said updated hard decisions are sufficiently correct;
- if said hard decisions are sufficiently correct, discontinuing said PCCC decoding procedure in regard to the current one of said synthesized sets of "better" soft decisions; and
- if said hard decisions are not sufficiently correct and a maximum number of iterations of said PCCC decoding procedure is not reached, repeating said PCCC decoding procedure.

8. A method for receiving staggercast digital television signals composed of time-interleaved initial and subsequent transmissions of respectively coded similar data, said subsequent transmission transmitting ones of coded successive blocks of said data corresponding to respective ones of coded said successive blocks of data transmitted in said initial transmissions a prescribed time interval earlier, said method comprising steps of:
- receiving said time-interleaved initial and subsequent transmissions of said respectively coded similar data;
- differentially delaying said initial and subsequent transmissions of said respectively coded similar data so as to be concurrently available; and
- decoding said initial transmissions and decoding said subsequent transmissions of said respectively coded similar data as differentially delayed so as to be concurrently available, said decoding of said initial transmissions and said decoding of said subsequent transmissions of said respectively coded similar data being concurrently and interdependently performed in respective decoding procedures that exchange soft decision information between them to improve decoding results from at least one of said respective decoding procedures.

9. The method of claim 8, wherein said coded similar data in said initial transmissions are coded with respective outer coding and further coded with respective inner coding, wherein said coded similar data in said subsequent transmissions are coded with respective outer coding and further coded with respective inner coding, and wherein said step of decoding said initial transmissions and decoding said subsequent transmissions of said respectively coded similar data comprises substeps of:

decoding respective inner coding of said initial and subsequent transmissions of said respectively coded similar data as differentially delayed so as to be concurrently available, so as to generate respective sets of soft decisions concerning said similar data from said initial transmissions and concerning said similar data from said subsequent transmissions;

generating synthesized sets of "better" soft decisions concerning results of inner decoding of said similar data, as derived from comparison of said set of soft decisions concerning said similar data from said initial transmissions with said set of soft decisions concerning said similar data from said subsequent transmissions; and decoding outer coding of said initial and subsequent transmissions of said respectively coded similar data as differentially delayed so as to be concurrently available, based on said synthesized sets of "better" soft decisions concerning said results of inner decoding said similar data.

10. The method of claim 9, wherein the outer coding employed in said subsequent transmission is substantially the same as the outer coding employed in said initial transmission in regard to data bits, parity bits and any interleaving between said outer coding and said inner coding.

11. The method of claim 9, wherein the outer coding employed in said subsequent transmission differs from the outer coding employed in said initial transmission, but is similar in regard to data bits and interleaving of those data bits between said outer convolutional coding and said inner convolutional coding.

12. The method of claim 8, wherein said step of decoding said initial transmissions and decoding said subsequent transmissions of said respectively coded similar data as differentially delayed so as to be concurrently available comprises substeps of:

iteratively decoding said initial transmission of each of said coded successive blocks of said similar data in a respective iterative decoding procedure;

iteratively decoding said subsequent transmission of each of said coded successive blocks of said similar data in a respective iterative decoding procedure; and exchanging soft decision information between said respective iterative decoding procedures for said initial and said subsequent transmissions of each of said successive blocks of said similar data.

13. The method of claim 12, wherein said initial transmission of each of said coded successive blocks of said similar data includes respective concatenated outer convolutional coding and inner convolutional coding of said similar data, wherein said substeps of iteratively decoding said initial transmissions of said coded successive blocks of said similar data are respective turbo decoding procedures, wherein said subsequent transmission of each of said coded successive blocks of said similar data includes respective concatenated outer convolutional coding and inner convolutional coding of said similar data, and wherein said substeps of iteratively decoding said subsequent transmissions of said coded successive blocks of said similar data are respective turbo decoding procedures.

14. A method for receiving digital television signals that utilize staggercast serially concatenated convolutional coding (SCCC), said SCCC generated by inner convolutional coding of outer convolutional coding of successive blocks of data, said method comprising steps of:

receiving time-interleaved initial and subsequent SCCC transmissions of said staggercast SCCC, said subsequent SCCC transmission transmitting each of said successive blocks of data corresponding to respective ones of said successive blocks of data transmitted in said initial SCCC transmissions a prescribed time interval earlier;

differentially delaying said initial and subsequent transmissions of said staggercast SCCC so as to be concurrently available;

decoding the inner convolutional coding of said initial and subsequent transmissions of said staggercast SCCC as differentially delayed so as to be concurrently available, thus to generate respective sets of soft decisions concerning said outer convolutional coding of said initial transmission of said staggercast SCCC and concerning said outer convolutional coding of said subsequent transmission of said staggercast SCCC;

generating synthesized sets of "better" soft decisions derived from comparison of said respective sets of soft decisions concerning the outer convolutional coding of said initial and subsequent transmissions of said staggercast SCCC as differentially delayed so as to be concurrently available; and decoding said outer convolutional coding as reproduced within said synthesized sets of "better" soft decisions, thereby to recover information content from said digital television signals.

15. The method of claim 14 for receiving digital television signals that utilize staggercast SCCC wherein the outer convolutional coding employed in said subsequent transmission of said staggercast SCCC is substantially the same as the outer convolutional coding employed in said initial transmission of said staggercast SCCC in regard to data bits, parity bits and interleaving between said outer convolutional coding and said inner convolutional coding.

16. The method of claim 15, wherein said step of generating synthesized sets of "better" soft decisions comprises substeps of:

comparing respective sets of soft decisions concerning corresponding data bits of the outer convolutional coding of said initial and subsequent transmissions of said staggercast SCCC as differentially delayed so as to be concurrently available;

selecting a soft decision of each pair of soft decisions concerning corresponding data bits that is at least as likely as the other to be correct as the "better" soft decision, for inclusion in a current one of said synthesized sets of "better" soft decisions;

comparing respective sets of soft decisions concerning corresponding parity bits of the outer convolutional coding of said initial and subsequent transmissions of said staggercast SCCC as differentially delayed so as to be concurrently available; and selecting a soft decision of each pair of soft decisions concerning corresponding parity bits that is at least as likely as the other to be correct as the "better" soft decision, for inclusion in said current one of said synthesized sets of "better" soft decisions.

17. The method of claim 16, wherein said step of decoding said outer convolutional coding as reproduced within said synthesized sets of "better" soft decisions is performed using a turbo decoding procedure comprising the substeps of:
  decoding said outer convolutional coding as reproduced within each successive one of said synthesized sets of "better" soft decisions, thereby to generate a set of hard decisions and an updated set of soft decisions;
  determining whether said hard decisions are sufficiently correct;
  if said hard decisions are sufficiently correct, discontinuing said turbo decoding procedure in regard to the current one of said synthesized sets of "better" soft decisions;
  if said hard decisions are not sufficiently correct, developing extrinsic information from said updated set of soft decisions; and
  repeating the step of decoding the inner convolutional coding of said initial and subsequent transmissions of said staggercast SCCC and the succeeding steps of the method per claims 1, 2 and 3.

18. The method of claim 14 for receiving digital television signals that utilize staggercast SCCC wherein the outer convolutional coding employed in said subsequent transmission of said staggercast SCCC differs from the outer convolutional coding employed in said initial transmission of said staggercast SCCC, but is similar in regard to data bits and interleaving of those data bits between said outer convolutional coding and said inner convolutional coding.

19. The method of claim 18, wherein said step of generating synthesized sets of "better" soft decisions comprises substeps of:
  comparing respective sets of soft decisions concerning corresponding data bits of the outer convolutional coding of said initial and subsequent transmissions of said staggercast SCCC as differentially delayed so as to be concurrently available;
  selecting a soft decision of each pair of soft decisions concerning corresponding data bits that is at least as likely as the other to be correct as the "better" soft decision, for inclusion in a current one of said synthesized sets of "better" soft decisions;
  including soft decisions concerning parity bits of the outer convolutional coding of said initial transmission of said staggercast SCCC in said current one of said synthesized sets of "better" soft decisions; and
  including soft decisions concerning parity bits of the outer convolutional coding of said subsequent transmission of said staggercast SCCC in said current one of said synthesized sets of "better" soft decisions.

20. The method of claim 19, for receiving digital television signals in which said outer convolutional coding employed in said initial and subsequent transmissions of said staggercast SCCC is provided by parallel concatenated convolutional coding (PCCC), wherein said step of decoding said outer convolutional coding as reproduced within said synthesized sets of "better" soft decisions is performed using a PCCC decoding procedure that comprises substeps of:
  decoding said outer convolutional coding as defined by "better" soft decisions concerning data bits and parity bits of the outer convolutional coding of said subsequent transmission of said staggercast SCCC to generate updated "better" soft decisions and hard decisions concerning data bits of said staggercast SCCC;
  determining whether said hard decisions are sufficiently correct;
  if said hard decisions are sufficiently correct, discontinuing said PCCC decoding procedure in regard to the current one of said synthesized sets of "better" soft decisions;
  if said hard decisions are not sufficiently correct, decoding said outer convolutional coding as defined by said updated "better" soft decisions concerning data bits of said staggercast SCCC and by soft decisions concerning parity bits of the outer convolutional coding of said initial transmission of said staggercast SCCC to generate further updated "better" soft decisions and updated hard decisions concerning data bits of said staggercast SCCC;
  determining whether said updated hard decisions are sufficiently correct;
  if said hard decisions are sufficiently correct, discontinuing said PCCC decoding procedure in regard to the current one of said synthesized sets of "better" soft decisions; and
  if said hard decisions are not sufficiently correct and a maximum number of iterations of said PCCC decoding procedure is not reached, repeating said PCCC decoding procedure.

21. A method for receiving digital television signals that utilize staggercast concatenated coding, said concatenated coding generated by inner coding of outer coding of successive blocks of data, said method comprising steps of:
  receiving time-interleaved initial and subsequent concatenated-coding transmissions of said staggercast concatenated coding, said subsequent concatenated-coding transmission transmitting each of said successive blocks of data corresponding to respective ones of said successive blocks of data transmitted in said initial concatenated-coding transmissions a prescribed time interval earlier;
  decoding the inner convolutional coding of said initial and subsequent transmissions of said staggercast concatenated-coding, so as to generate respective sets of soft decisions concerning said outer coding of said initial transmission of said staggercast concatenated-coding and concerning said outer coding of said subsequent transmission of said staggercast concatenated-coding;
  generating synthesized sets of "better" soft decisions derived from comparison of said respective sets of soft decisions concerning the outer convolutional coding of said initial and subsequent transmissions of said staggercast concatenated-coding; and
  decoding said outer coding as reproduced within said synthesized sets of "better" soft decisions, thereby to recover information content from said digital television signals.

22. The method of claim 21, for receiving digital television signals in which said concatenated coding employed in said initial and subsequent transmissions of said staggercast comprises concatenated convolutional coding.

* * * * *